(12) United States Patent
Kim et al.

(10) Patent No.: US 11,073,955 B2
(45) Date of Patent: Jul. 27, 2021

(54) DISPLAY DEVICE

(71) Applicant: Samsung Display Co., Ltd., Yongin-Si (KR)

(72) Inventors: Kiwook Kim, Hwaseong-si (KR);
Kwangmin Kim, Seoul (KR);
Yangwan Kim, Hwaseong-si (KR);
Jisu Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/504,341

(22) Filed: Jul. 8, 2019

(65) Prior Publication Data

US 2020/0081580 A1    Mar. 12, 2020

(30) Foreign Application Priority Data

Sep. 12, 2018  (KR) .......................... 10-2018-0109297
Oct. 26, 2018  (KR) .......................... 10-2018-0129168

(51) Int. Cl.
*G06F 3/044* (2006.01)
*G06F 3/041* (2006.01)
(Continued)

(52) U.S. Cl.
CPC .......... *G06F 3/0446* (2019.05); *G06F 3/0412* (2013.01); *G06F 3/0448* (2019.05); *H01L 27/323* (2013.01); *H01L 33/06* (2013.01)

(58) Field of Classification Search
CPC .... G06F 3/0412; G06F 3/0443; G06F 3/0446; G06F 3/0448; H01L 27/3216; H01L 27/323; H01L 33/06; H01L 51/502
(Continued)

(56) References Cited

U.S. PATENT DOCUMENTS 10,429,979 B2    10/2019 Du et al.
2013/0341651 A1  12/2013 Kim et al.
(Continued)

FOREIGN PATENT DOCUMENTS

CN    108008862    5/2018
EP      2811379   12/2014
(Continued)

OTHER PUBLICATIONS

Extended European Search Report dated Feb. 14, 2020, issued in European Patent Application No. 19195168.0.

*Primary Examiner* — Tony O Davis
(74) *Attorney, Agent, or Firm* — H.C. Park & Associates, PLC

(57) ABSTRACT

A display device including an input sensor divided into a plurality of first sensing areas and a plurality of second sensing areas, which are alternately disposed, and the plurality of first sensing areas and the plurality of second sensing areas have the same area. Each of the plurality of first sensing areas and the plurality of second sensing areas includes a corresponding crossing area of crossing areas between a plurality of first sensing electrodes and a plurality of second sensing electrodes. Openings of the sensing electrodes disposed on each of the plurality of first sensing areas have a first arrangement, and openings of the sensing electrodes disposed on each of the plurality of second sensing areas have a second arrangement different from the first arrangement.

20 Claims, 33 Drawing Sheets

(51) Int. Cl.
   *H01L 27/32*   (2006.01)
   *H01L 33/06*   (2010.01)
(58) Field of Classification Search
   USPC .................................................. 345/170–178
   See application file for complete search history.

(56) References Cited

U.S. PATENT DOCUMENTS

| | | |
|---|---|---|
| 2014/0362034 A1 | 12/2014 | Mo et al. |
| 2015/0268761 A1 | 9/2015 | Yang |
| 2016/0034103 A1* | 2/2016 | Yoshikawa ............... G06F 1/16 |
| | | 345/174 |
| 2016/0103516 A1 | 4/2016 | An |
| 2016/0109998 A1 | 4/2016 | Watanabe |
| 2018/0031880 A1 | 2/2018 | Kwak et al. |
| 2018/0129352 A1* | 5/2018 | Kim ...................... G06F 3/0412 |
| 2018/0164931 A1 | 6/2018 | Na et al. |
| 2019/0004626 A1* | 1/2019 | Ko ........................ G06F 3/0443 |
| 2019/0369787 A1* | 12/2019 | Park ........................ G06F 3/044 |
| 2020/0293150 A1* | 9/2020 | Jeong ................. G06F 3/04164 |
| 2020/0319735 A1* | 10/2020 | Kim ..................... G06F 3/0443 |

FOREIGN PATENT DOCUMENTS

| | | |
|---|---|---|
| EP | 3333683 | 6/2018 |
| KR | 10-2016-0080959 | 7/2016 |
| KR | 10-2018-0014390 | 2/2018 |
| KR | 10-2018-0052830 | 5/2018 |
| KR | 10-2019-0117866 | 10/2019 |

\* cited by examiner

DISPLAY DEVICE

CROSS-REFERENCE TO RELATED APPLICATIONS

This application claims priority from and the benefit of Korean Patent Application Nos. 10-2018-0109297, filed on Sep. 12, 2018, and 10-2018-0129168, filed on Oct. 26, 2018, which are hereby incorporated by reference for all purposes as if fully set forth herein.

BACKGROUND

Field

Exemplary embodiments of the invention relate generally to a display device, and more specifically, to a display device including an input sensor.

Discussion of the Background

Various display apparatuses used in multimedia equipment such as televisions, mobile phones, table computers, navigation devices, and game consoles are being developed. Such a display device includes a keyboard or a mouse as an input unit. Also, such a display device includes a touch sensor as an input unit.

The above information disclosed in this Background section is only for understanding of the background of the inventive concepts, and, therefore, it may contain information that does not constitute prior art.

SUMMARY

Devices constructed according to exemplary embodiments of the invention are capable of providing a display device including an input sensor having improved sensing sensitivity.

Additional features of the inventive concepts will be set forth in the description which follows, and in part will be apparent from the description, or may be learned by practice of the inventive concepts.

An exemplary embodiment of the inventive concepts provides a display device including a display panel including a plurality of emission areas in which a plurality of light emitting elements is disposed and an input sensor disposed above the display panel and including a sensing area and a line area. The input sensor includes a plurality of first sensing electrodes which are disposed on the sensing area and in which a plurality of openings corresponding to the emission areas are defined, a plurality of second sensing electrodes which are disposed on the sensing area to cross the plurality of first sensing electrode and in which a plurality of openings corresponding to the plurality of emission areas are defined, and signal lines disposed on the line area and connected to the plurality of first sensing electrodes and the plurality of second sensing electrodes. At least a portion of the sensing area is divided into a plurality of first sensing areas and a plurality of second sensing areas, which are alternately disposed, and the plurality of first sensing areas and the plurality of second sensing areas have the same area. Each of the plurality of first sensing areas and the plurality of second sensing areas includes a corresponding crossing area of crossing areas between a plurality of first sensing electrodes and a plurality of second sensing electrodes. Openings defined in each of the plurality of first sensing areas have a first arrangement, and openings defined in each of the plurality of second sensing areas have a second arrangement different from the first arrangement.

In an exemplary embodiment, the plurality of emission areas may include: a first emission area having a first surface area; a second emission area having a second surface area different from the first surface area; and a third emission area having a third surface area different from each of the first and second surface areas. The first emission area, the second emission area, and the third emission area provide different color of light each other.

In an exemplary embodiment, the plurality of openings having the first arrangement and the plurality of openings having the second arrangement may include a first opening corresponding to the first emission area, a second opening corresponding to the second emission area, and a third opening corresponding to the third emission area.

In an exemplary embodiment, emission areas, which are disposed on each of the plurality of first sensing areas, of the plurality of emission areas may be defined as a first emission area group, and emission areas, which are disposed on each of the plurality of second sensing areas, of the plurality of emission areas may be defined as a second emission area group. In an exemplary embodiment, each of the first emission area group and the second emission area group may include cell units arranged in an n×n matrix, where n may be a natural number of 10 or more. In an exemplary embodiment, the cell units may include first cell units and second cell units. In an exemplary embodiment, each of the first cell units may include the first emission area and the third emission area, which are disposed in a diagonal direction. In an exemplary embodiment, each of the second cell units may include the second emission area and the third emission, which are arranged in a diagonal direction. In an exemplary embodiment, the first cell units and the second cell units of the first emission area group may have a first arrangement, and the first cell units and the second cell units of the second emission area group may have a second arrangement different from the first arrangement. In an exemplary embodiment, n may be an odd number.

In an exemplary embodiment, the third emission area of each of the first cell units may be a first type emission area, and the third emission area of each of the second cell units may be a second type emission area, and the first type emission area and the second type emission area may have shape different from each other on a plane. The first emission area, the second emission area, and the third emission area provide different color of light each other In an exemplary embodiment, a first boundary pattern defined by disconnection points of the first sensing electrode and the second sensing electrode, which correspond to each of the plurality of first sensing areas, of the plurality of first sensing electrodes and the plurality of second sensing electrodes may be different from a second boundary pattern defined by disconnection points of the first sensing electrode and the second sensing electrode, which correspond to each of the plurality of second sensing areas, of the plurality of first sensing electrodes and the plurality of second sensing electrodes.

In an exemplary embodiment, the input sensor may further include a dummy pattern that is insulated from the plurality of first sensing electrodes and the plurality of second sensing electrodes. In an exemplary embodiment, the plurality of first sensing areas and the plurality of second sensing areas may be arranged in a p×q matrix, where each of p and q may be a natural number of 5 or more. In an exemplary embodiment, the dummy pattern may be disposed at a center of an area defined by a (k, j) sensing area, a (k+1, j) sensing area, a (k, j+1) sensing area, and a (k+1, j+1) sensing area of the sensing areas arranged in the p×q matrix, where k may be a natural number of q or less, and j may be a natural number of q or less.

In an exemplary embodiment, the at least the portion of the sensing area is defined as an inner sensing area, and the sensing area may further include an outer sensing area disposed outside the inner sensing area. In an exemplary embodiment, the outer sensing area may include a plurality of third sensing areas adjacent to the plurality of first sensing areas and a plurality of fourth sensing areas adjacent to the plurality of second sensing areas. In an exemplary embodiment, the plurality of openings of each of the plurality of third sensing areas may have a third arrangement different from the first arrangement and the second arrangement, and the plurality of openings of each of the plurality of fourth sensing areas may have a fourth arrangement different from the first arrangement and the second arrangement.

In an exemplary embodiment, each of the plurality of third sensing areas may have a surface area different from that of each of the plurality of first sensing areas.

In an exemplary embodiment, the at least the portion of the sensing area may be defined as a first inner sensing area, and the sensing area may further include a second inner sensing area disposed adjacent to the first inner sensing area. In an exemplary embodiment, the second inner sensing area may include third sensing areas adjacent to the first sensing areas and a plurality of fourth sensing areas adjacent to the a plurality of second sensing areas, and the plurality of first sensing areas and the plurality of second sensing areas, and the plurality of third sensing areas and the plurality of fourth sensing areas may have the same surface area. In an exemplary embodiment, each of the plurality of first sensing electrodes and the plurality of second sensing electrodes may include a mesh line defining the plurality of openings. In an exemplary embodiment, the plurality of openings may include first openings having a first surface area, second openings having a second surface area different from the first surface area, and third openings having a third surface area different from the first surface area and the second surface area. In an exemplary embodiment, the mesh line disposed on each of the plurality of first sensing areas may have a first shape, the mesh line disposed on each of the plurality of second sensing areas may have a second shape different from the first shape, the mesh line disposed on each of the plurality of third sensing areas may have a third shape different from the first shape and the second shape, and the mesh line disposed on each of the plurality of fourth sensing areas may have a fourth shape different from the first shape, the second shape, and the third shape.

In an exemplary embodiment, the plurality of first sensing electrodes may be arranged in a first direction and extend in a second direction crossing the first direction, each of the plurality of first sensing electrodes may include first sensing parts arranged in the second direction and first connection parts disposed between adjacent sensing parts of the first sensing parts. In an exemplary embodiment, each of the plurality of second sensing electrodes may include second sensing parts arranged in the first direction and second connection parts disposed between adjacent sensing parts of the second sensing parts. In an exemplary embodiment, one of the first connection parts and the second connection parts may be disposed on a layer different from those of the first sensing parts and the second sensing parts, and the other is disposed on the same layer as the first sensing parts and the second sensing parts.

In an exemplary embodiment, the input sensor may further include: first floating patterns disposed inside the first sensing parts on a plane and apart from the first sensing parts; and second floating patterns disposed inside the second sensing parts on a plane and apart from the second sensing parts.

In an exemplary embodiment, the input sensor may further include third connection parts connecting the first floating patterns to each other.

In an exemplary embodiment, at least one of the first floating patterns may include: a central part; and extension parts disposed on both sides of the central part in the second direction In an exemplary embodiment, each of the extension parts may be connected to a corresponding third connection part of the third connection parts.

In an exemplary embodiment, each of the plurality of first sensing areas may include: a corresponding first connection part of the first connection parts: a half of a first sensing part disposed on one side of the corresponding first connection part of the first sensing part in the second direction and a half of a first sensing part disposed on the other side of the corresponding first connection part in the second direction, a corresponding second connection part of the second connection part, and a half of a second sensing part disposed on one side of the corresponding second connection part in the first direction and a half of a second sensing part disposed on the other side of the corresponding second connection part in the first direction.

In an exemplary embodiment, the signal lines may include: first signal lines electrically connected through one end of each of even-numbered electrode of the plurality of first sensing electrodes; second signal lines electrically connected through the other end of each of odd-numbered electrodes of the plurality of first sensing electrodes; and third signal lines electrically connected to the plurality of second sensing electrodes.

In an exemplary embodiment of the inventive concepts, each of the plurality of light emitting elements comprises a first electrode, a second electrode apart from the first electrode, and a light emitting layer disposed between the first electrode and the second electrode, and the light emitting layer comprises at least one of quantum dot and a quantum rod.

In an exemplary embodiment of the inventive concepts, a display device includes a display panel and an input sensor disposed above the display panel. In an exemplary embodiment, the input sensor includes a plurality of first sensing electrodes and a plurality of second sensing electrodes crossing the plurality of first sensing electrodes. In an exemplary embodiment, each of the plurality of first sensing electrodes and the plurality of second sensing electrodes includes a mesh line defining first openings having a first surface area, second openings having a second surface area different from the first surface area, and third openings having a third surface area different from the first surface area and the second surface area. At least a portion of areas on which the plurality of first sensing electrodes and the plurality of second sensing electrodes is disposed is divided into a plurality of first sensing areas and a plurality of second sensing areas, which are alternately disposed, and the plurality of first sensing areas and the plurality of second sensing areas have the same area. Each of the plurality of first sensing areas and the plurality of second sensing areas includes a corresponding crossing area of crossing areas between a plurality of first sensing electrodes and a plurality of second sensing electrodes. The mesh line disposed on each of the plurality of first sensing areas has a first shape, and the mesh line disposed on each of the plurality of second sensing areas has a second shape different from the first shape.

In an exemplary embodiment, the display panel may include first emission areas corresponding to the first openings, second emission areas corresponding to the second openings, and third emission areas corresponding to the third openings. In an exemplary embodiment, the first emission areas, the second emission areas, and the third emission areas may be arranged to define a plurality of emission area rows. In an exemplary embodiment, a 1-th emission area of a 1-th emission area row corresponding to each of the plurality of first sensing areas may be one of the first emission areas, and a 1-th emission area of a 1-th emission area row corresponding to each of the plurality of second sensing areas may be one of the second emission areas.

In an exemplary embodiment, a first boundary pattern defined by disconnection points of the mesh line of the first sensing electrode and the mesh line of the second sensing electrode, which correspond to each of the plurality of first sensing areas, of the plurality of first sensing electrodes and the plurality of second sensing electrodes may be different from a second boundary pattern defined by disconnection points of the mesh line of the first sensing electrode and the mesh line of the second sensing electrode, which correspond to each of the plurality of second sensing areas, of the plurality of first sensing electrodes and the plurality of second sensing electrodes.

In an exemplary embodiment, the display panel includes an organic light emitting display panel or a quantum dot light emitting display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
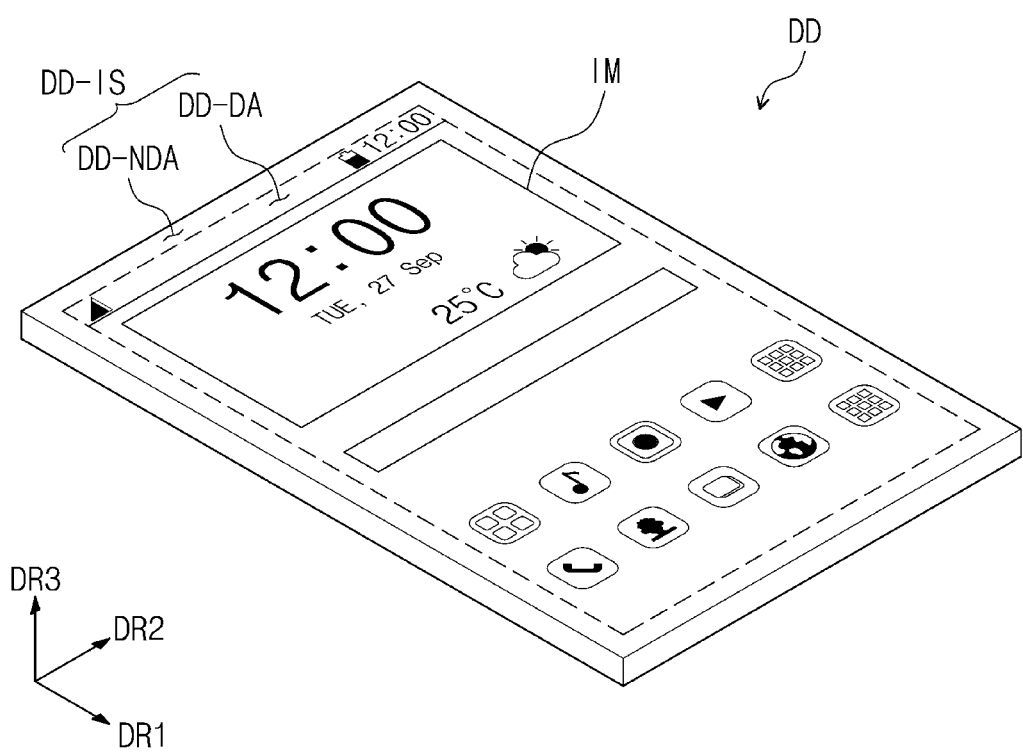
FIG. 1 is a perspective view of a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device DD according to an exemplary embodiment of the inventive concepts. Referring to FIG. 1, the display device DD may display an image IM through a display surface DD-IS. The display surface DD-IS is parallel to a surface defined by a first directional axis DR1 and a second directional axis DR2. A normal direction of the display surface DD-IS, i.e., a thickness direction of the display device DD is indicated as a third directional axis DR3.

A front surface (or a top surface) and a rear surface (or a bottom surface) of each of members or units, which will be described below, are distinguished by the third directional axis DR3. However, the first to third directional axes illustrated in this embodiment may be merely examples. Hereinafter, first to third directions may be directions indicated by the first to third directional axes DR1, DR2, and DR3 and designated by the same reference numerals, respectively.

Although the display device DD having a planar display surface is illustrated in an exemplary embodiment of the inventive concepts, exemplary embodiments of the inventive concepts are not limited thereto. The display device DD may include a curved display surface or a solid display surface. The solid display surface may include a plurality of display areas that indicate different directions. For example, the solid display surface may include a polygonal column-type display surface.

The display device DD according to the current embodiment may be a rigid display device. However, exemplary embodiments of the inventive concepts are not limited thereto. For example, the display device DD according to the inventive concept may be a flexible display device DD. The flexible display device DD may include a foldable display device or a banding type display device of which a portion area is bendable.

According to this embodiment, the display device DD that is capable of being applied to a mobile terminal is exemplarily illustrated. Although not shown, electronic modules, a camera module, a power module, and the like, which are mounted on a main board, may be disposed on a bracket/case together with the display device DD to constitute the mobile terminal. The display device DD according to an exemplary embodiment of the inventive concepts may be applied to large-sized electronic devices such as televisions and monitors and small and middle-sized electronic devices such as tablet PC, navigation units for vehicles, game consoles, and smart watches.

As illustrated in FIG. 1, the display surface DD-IS includes an image area DD-DA on which an image IM is displayed and a bezel area DD-NDA adjacent to the image area DD-DA. The bezel area DD-NDA may be an area on which an image is not displayed. FIG. 1 illustrates an icon as an example of the image IM.

As illustrated in FIG. 1, the image area DD-DA may have a substantially rectangular shape. The "substantially rectangular shape" includes not only a rectangular shape as a mathematical sense but also a rectangular shape in which a vertex is not defined in a vertex area (or a corner area) but a boundary of a curve is defined.

The bezel area DD-NDA may surround the image area DD-DA. However, exemplary embodiments of the inventive concepts are not limited thereto. For example, the image area DD-DA and the bezel area DD-NDA may be relatively designed in shape.

FIGS. 2A to 2D are cross-sectional views of the display device according to an exemplary embodiment of the inventive concepts. FIGS. 2A to 2D illustrate cross-sections defined by the second directional axis DR2 and the third directional axis DR3. FIGS. 2A to 2D are simply illustrated to explain a lamination relationship of functional members constituting the display device DD.

The display device DD according to an exemplary embodiment of the inventive concepts may include a display panel, an input sensor, an anti-reflector, and a widow. At least portions of the display panel, the input sensor, the anti-reflector, and the window may be formed through a continuous process, and at least portions may be coupled to each other through an adhesion member. FIGS. 2A to 2D illustrate an optically clear adhesive (OCA) as an example of the adhesion member. Hereinafter, the adhesion member may include a general adhesive or adhesive agent. In an exemplary embodiment of the inventive concepts, the anti-reflector and the window may be replaced with different constituents or omitted.

In FIGS. 2A to 2D, a corresponding constituent of the input sensor, the anti-reflector, and the window, which is formed with respect to the other constituent through the continuous process, may be expressed as a "layer". Also, a constituent of the input sensor, the anti-reflector, and the window, which is coupled to the other constituent through the adhesion member, may be expressed as a "panel". The "panel" may include a base layer providing a base surface, for example, a synthetic film, a complex material film, a glass substrate, and the like, but the base layer may be omitted in the "layer". That is to say, the units expressed as the "layer" may be disposed on the base surface provided by the other unit.

Here, the input sensor, the anti-reflector, and the window may be called an input sensing panel ISP, an anti-reflection panel RPP, and a window panel WP or an input sensing layer ISL, an anti-reflection layer RPL, and a window layer WL.

Figure 2A:
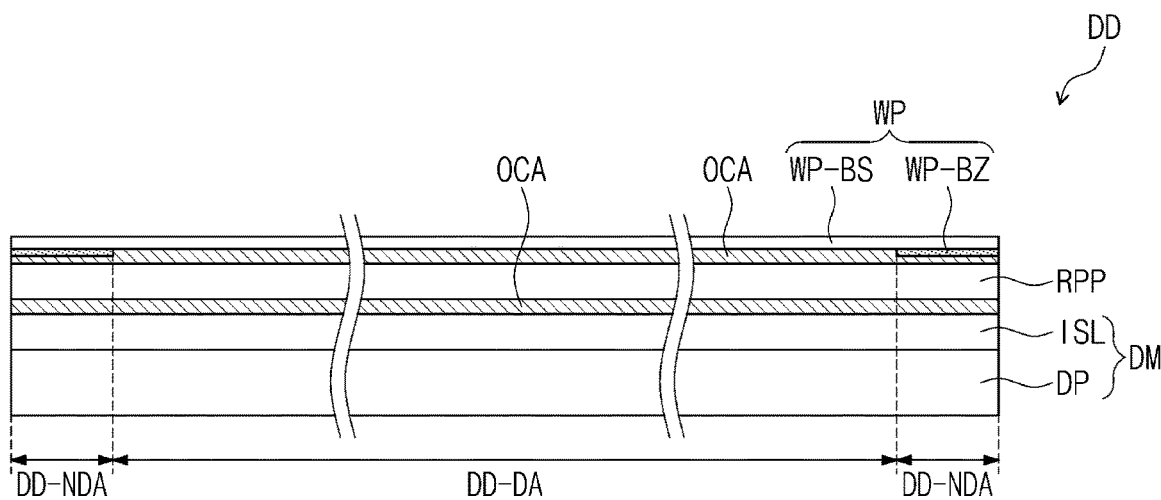
FIGS. 2A, 2B, 2C, and 2D are cross-sectional views of the display device according to an exemplary embodiment of the inventive concepts.
Figure 2A:
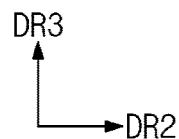

As illustrated in FIG. 2A, the display device DD may include a display panel DP, an input sensing layer ISL, an anti-reflection panel RPP, and a window panel WP. The input sensing layer ISL may be directly disposed on the display panel DP. In this specification, that "a constituent B is directly disposed on a constituent A" may mean that a separate adhesive layer/adhesive member is not disposed between the constituents A and B. The constituent B may be formed through the continuous process on the base surface provided by the constituent A after the constituent A is formed.

The display panel DP and the input sensing layer ISL directly disposed on the display panel DP may be defined as a display module DM. An optically clear adhesive (OCA) is disposed between the display module DM and the anti-reflection panel RPP and between the anti-reflection panel RPP and the window panel WP.

The display panel DP generates an image, and the input sensing layer ISL acquires coordinate information of an external input (for example, a touch event). Although not separately shown, the display module DM according to an exemplary embodiment of the inventive concepts may further include a protection member disposed on a bottom surface of the display panel DP. The protection member and the display panel DP may be coupled to each other through an adhesion member. The display devices DD of FIGS. 2B to 2D, which will be described below, may also further include the protection member.

The display panel DP according to an exemplary embodiment of the inventive concepts may be an emission type display panel, but is not limited thereto. For example, the display panel DP may be an organic light emitting display panel and a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

The anti-reflection panel RPP reduces reflectance of external light incident from an upper side of the window panel WP. The anti-reflection panel RPP according to an exemplary embodiment of the inventive concepts may include a retarder and a polarizer. The retarder may be a film type or liquid crystal coating type retarder and may include a λ/2 retarder and/or a λ/4 retarder. The polarizer may also be a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The retarder and polarizer itself or the protection film may be defined as a base layer of the anti-reflection panel RPP.

The anti-reflection panel RPP according to an exemplary embodiment of the inventive concepts may include color filters. The color filters may have predetermined arrangement. The color filters may be determined in arrangement in consideration of colors of light emitted from pixels provided in the display panel DP. The anti-reflection panel RPP may further include a black matrix adjacent to the color filters.

The anti-reflection panel RPP according to an exemplary embodiment of the inventive concepts may include a destructive interference structure. For example, the destructive interference structure include first reflection layer and a second reflection layer, which are disposed on layers different from each other. First reflected light and second reflected light, which are respectively reflected from the first reflection layer and the second reflection layer, may destructively interfere, and thus, the external light may be reduced in reflectance.

The window panel WP according to an exemplary embodiment of the inventive concepts includes a base layer WP-BS and a light blocking pattern WP-BZ. The base layer WP-BS may include a glass substrate and/or a synthetic film. The base layer WP-BS is not limited to a single layer. The base layer WP-BS may include two or more films that are coupled to each other through the adhesion member.

The light blocking pattern WP-BZ partially overlaps the base layer WP-BS. The light blocking pattern WP-BZ may be disposed on a rear surface of the base layer WP-BS. The light blocking pattern WP-BZ may substantially define the bezel area DD-NDA of the display device DD. An area on which the light blocking pattern WP-BZ is not disposed may be defined as the image area DD-DA of the display device DD. When limited to the window panel WP, an area on which the light blocking pattern WP-BZ is disposed may be defined as a light blocking area of the window panel WP, and an area on which the light blocking pattern WP-BZ is not disposed may be defined as a transmission area of the window panel WP.

The light blocking pattern WP-BZ may have a multilayered structure. The multilayered structure may include a colored color layer and a black light blacking layer. The colored color layer and the black light blocking layer may be formed through deposition, printing, and coating processes. Although not shown, the window panel WP may further include a functional coating layer disposed on an entire surface of the base layer WP-BS. The functional coating layer may include an anti-fingerprint layer, an anti-reflection layer, a hard coating layer, and the like. Hereinafter, referring to FIGS. 2B to 2D, the window panel WP and the window layer WL will be simply illustrated without distinguishing the base layer WP-BS and the light blocking pattern WP-BZ from each other.

Figure 2B:
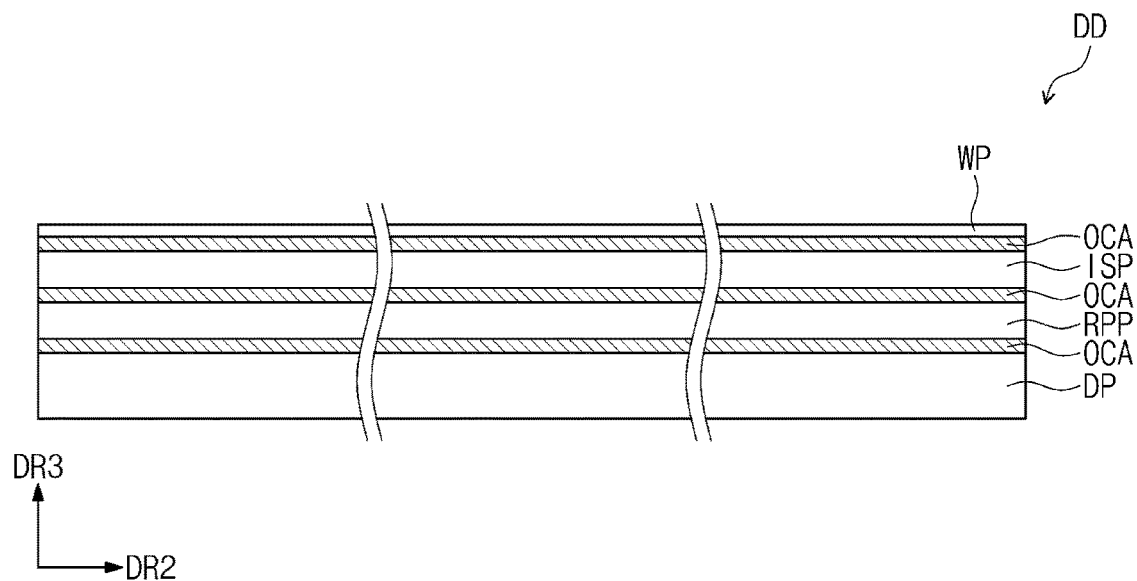
Figure 2B:
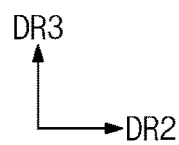
Figure 2C:
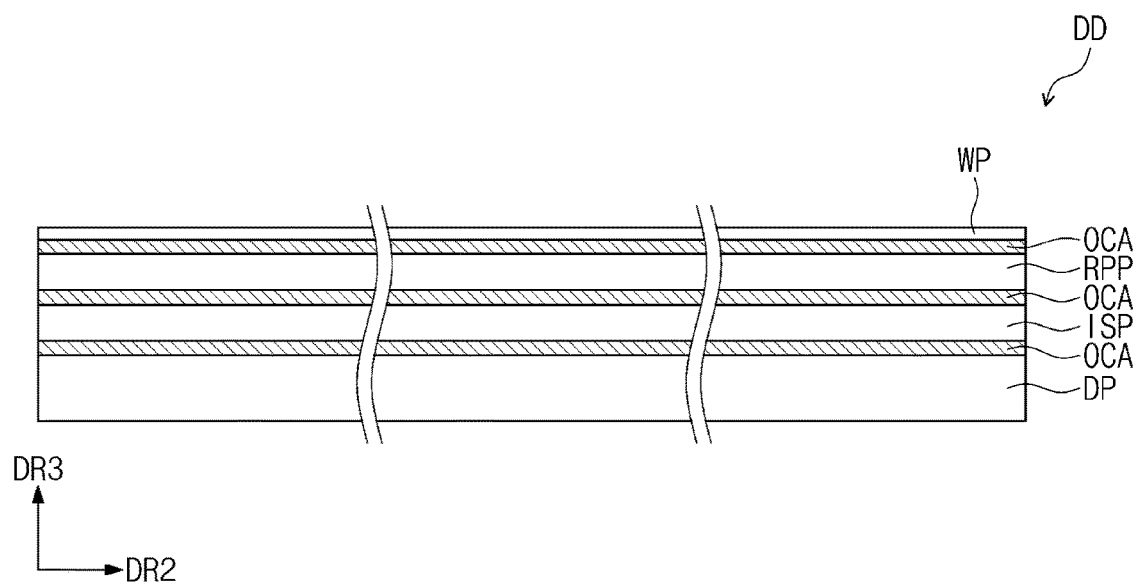

As illustrated in FIGS. 2B and 2C, the display device DD may include the display panel DP, the input sensing panel ISP, the anti-reflection panel RPP, and the window panel WP. A laminated order of the input sensing panel ISP and the anti-reflection panel RPP may be changed.

Figure 2D:
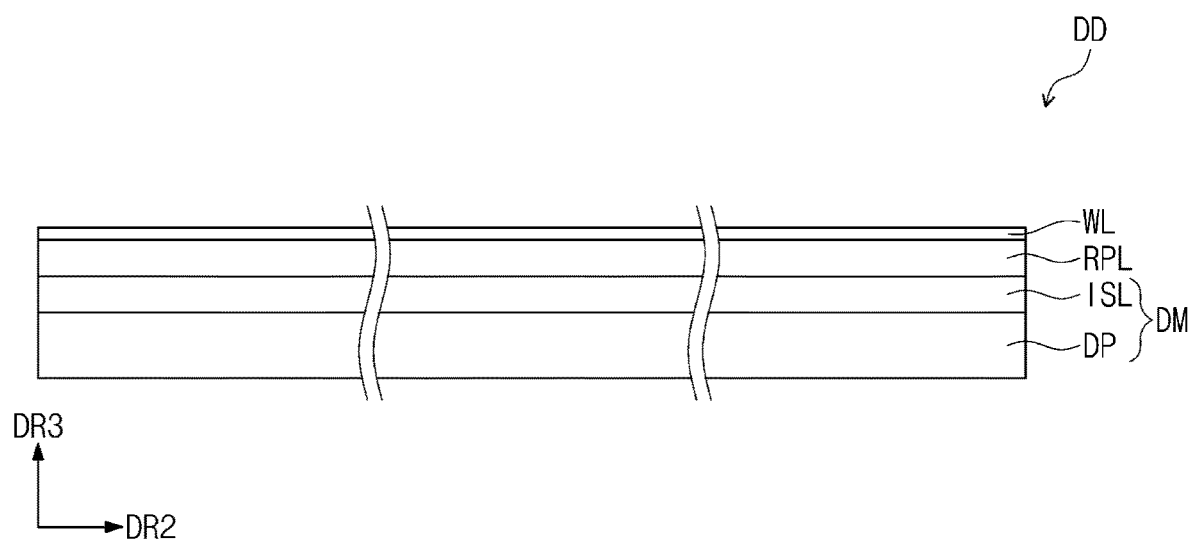

As illustrated in FIG. 2D, the display device DD may include the display panel DP, the input sensing layer ISL, the anti-reflection layer RPL, and the window layer WL. When compared with the display device DD of FIG. 2A, the optically clear adhesives (OCA) may be omitted, and the input sensing layer ISL, the anti-reflection layer RPL, and the window layer WL may be formed on the base surface provided on the display panel DP through the continuous process. A laminated order of the input sensing layer ISL and the anti-reflection panel RPP may be changed.

Figure 3A:
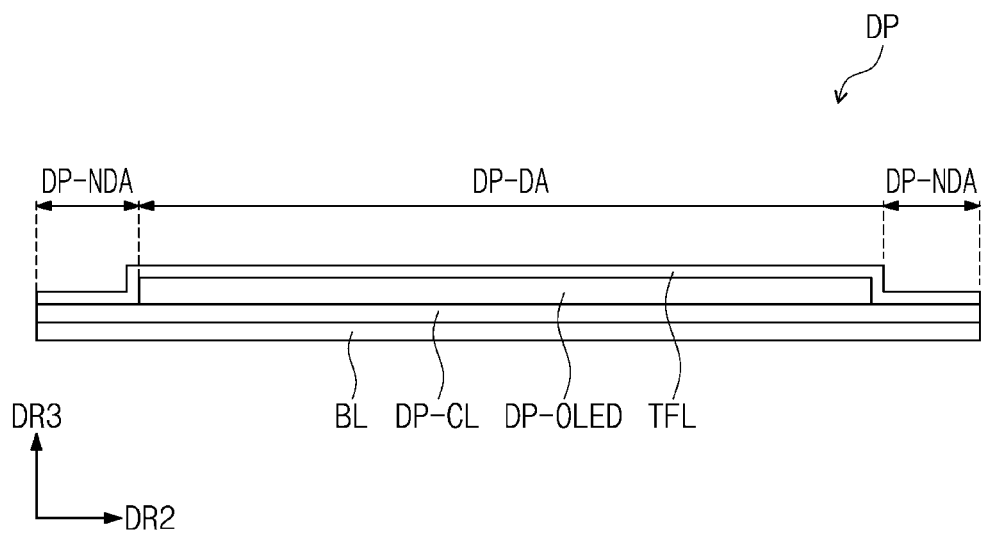
FIGS. 3A and 3B are cross-sectional views of a display panel according to an exemplary embodiment of the inventive concepts.
Figure 3B:
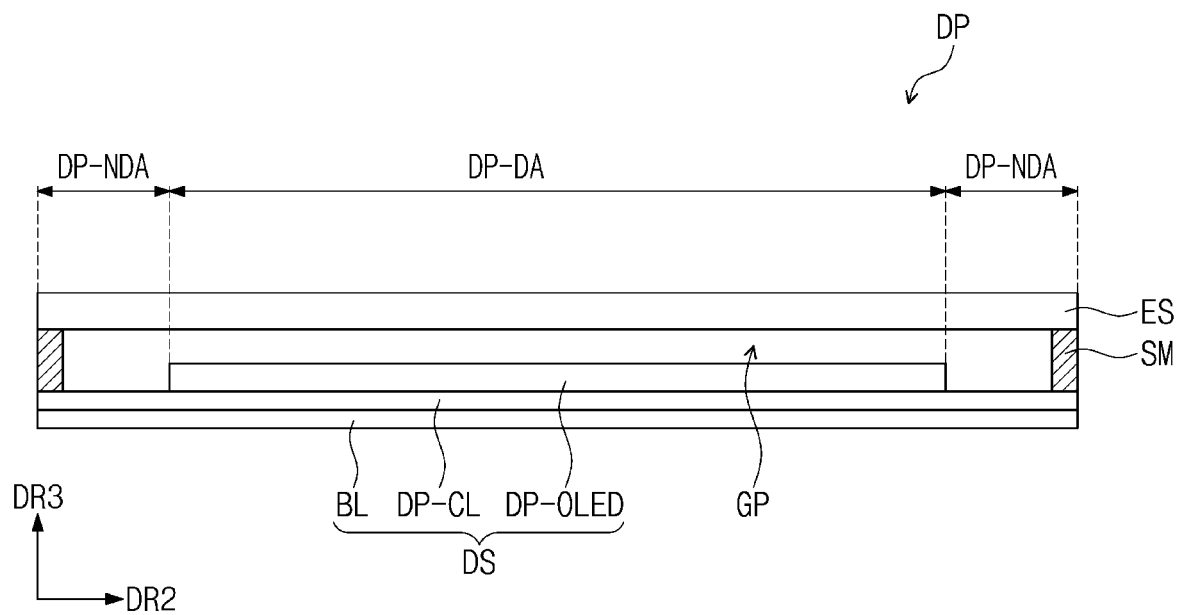

FIGS. 3A and 3B are cross-sectional views of the display panel DD according to an exemplary embodiment of the inventive concepts.

As illustrated in FIG. 3A, the display panel DP may include a base layer BL, a circuit element layer DP-CL disposed on the base layer BL, a display element layer DP-OLED, and an upper insulation layer TFL. A display area DP-DA and a non-display area DP-NDA, which correspond to the image area DD-DA and the bezel area DD-NDA of FIG. 1, may be defined. In this exemplary embodiment, that an area corresponds to an area may means that the areas overlap each other and have the same surface area/shape, but is not limited thereto.

The base layer BL may include at least one plastic film. The base layer BL may include a plastic substrate, a glass substrate, a metal substrate, and an organic/inorganic composite substrate.

The circuit element layer DP-CL includes at least one insulation layer and a circuit element. The insulation layer includes at least one inorganic film and at least one organic film. The circuit element includes signal lines, a driving circuit of the pixel, and the like. This will be described later in detail.

The display element layer DP-OLED may include organic light emitting diodes. The display element layer DP-OLED may further include an organic film such as a pixel defining layer.

The upper insulation layer TFL may include a plurality of thin films. One portion of the thin films may be disposed to improve optical efficiency, and the portion of the thin film may be disposed to protect the organic light emitting diodes. The upper insulation layer TFL will be described later in detail.

As illustrated in FIG. 3A, the display panel DP may include a base layer BL, a circuit element layer DP-CL disposed on the base layer BL, a display element layer DP-OLED, an encapsulation layer ES, and a sealant coupling the base layer BL to the encapsulation layer ES. The encapsulation layer ES may be spaced a predetermined gap GP from the display element layer DP-OLED. Each of the base layer BL and the encapsulation layer ES may include a plastic substrate, a glass substrate, a metal substrate, and an organic/inorganic composite substrate. The sealant SM may include an organic adhesion member or frit.

Figure 4:
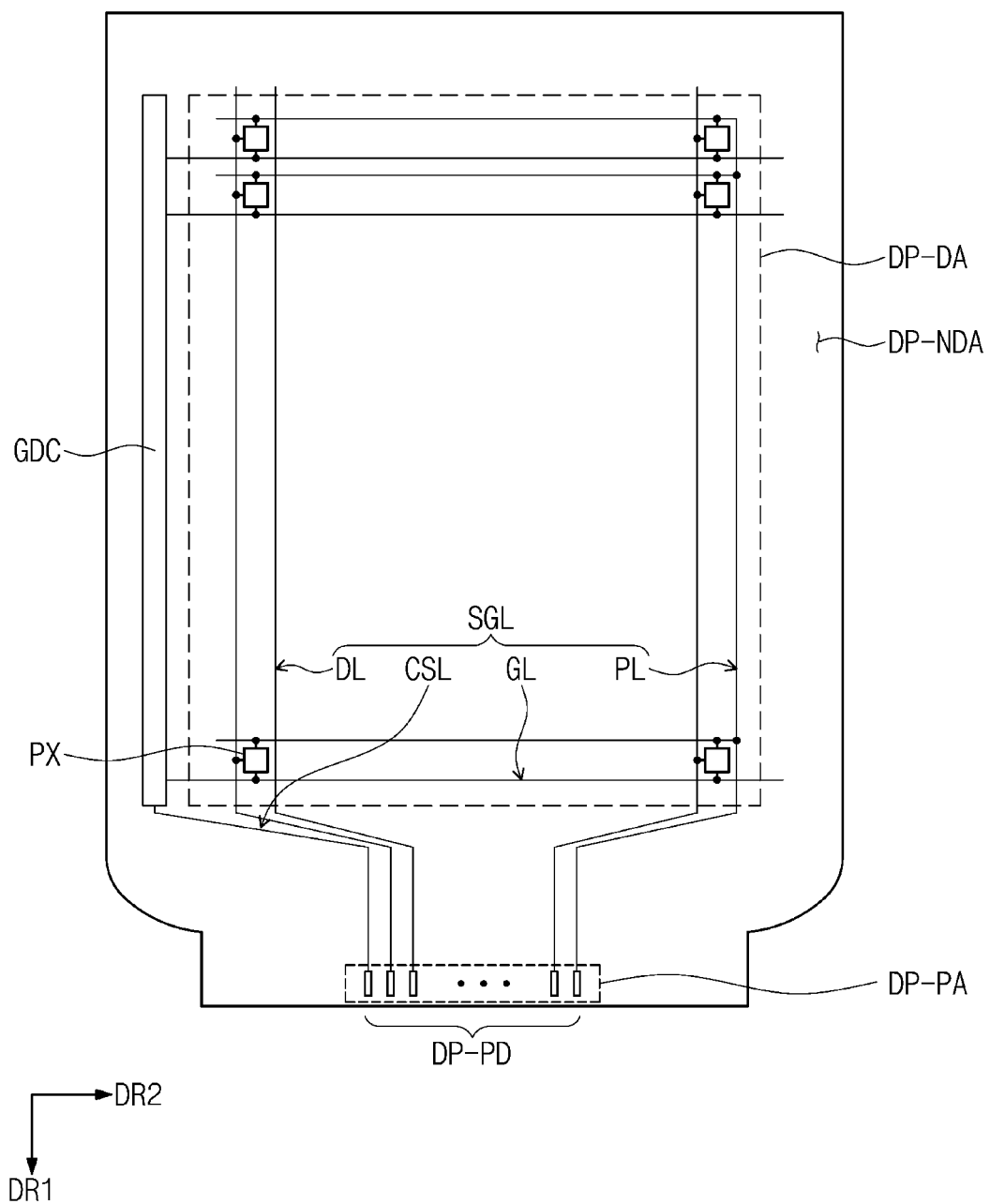
FIG. 4 is a plan view of a display panel according to an exemplary embodiment of the inventive concepts.
Figure 5A:
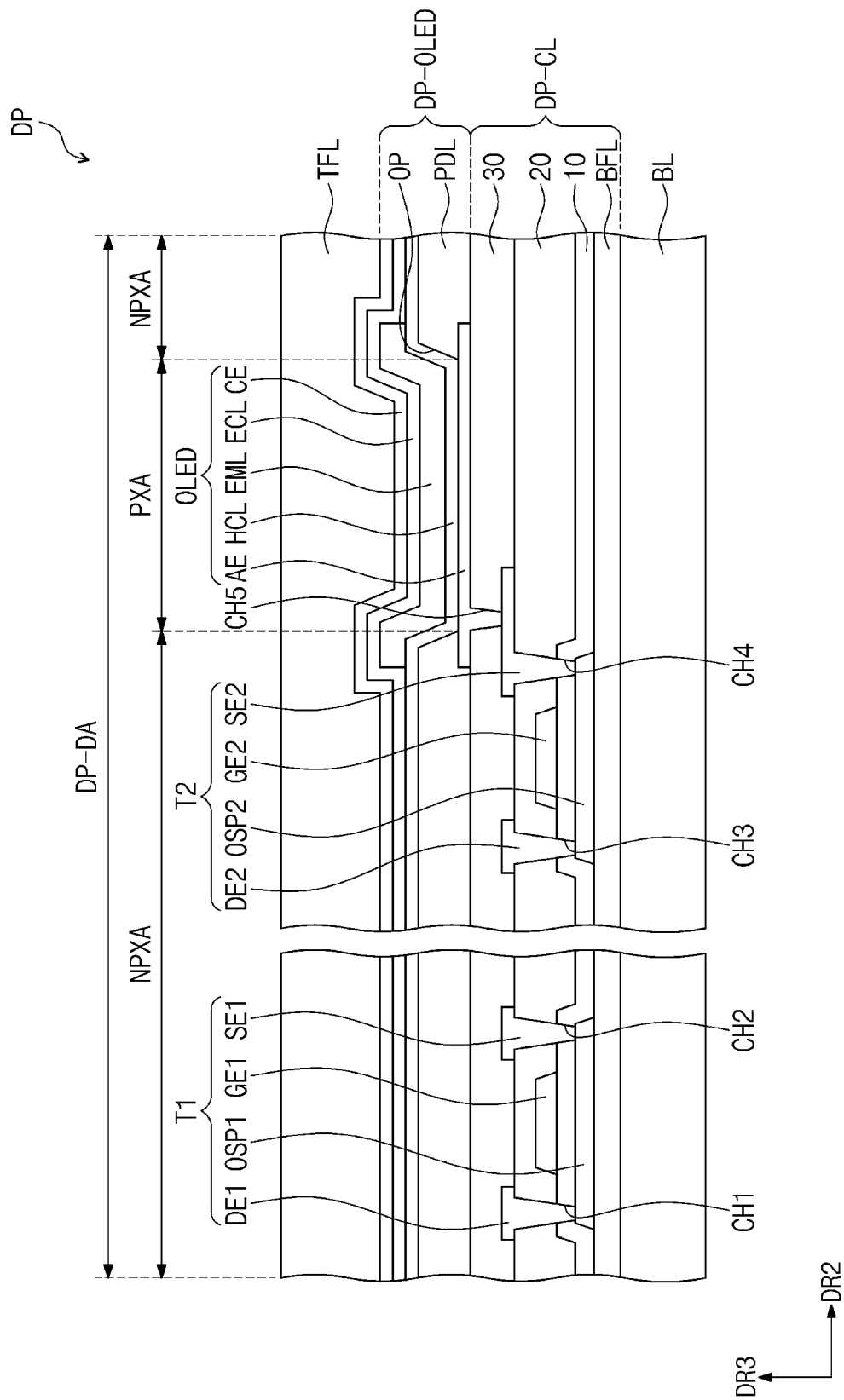
FIG. 5A is an enlarged cross-sectional view of the display panel according to an exemplary embodiment of the inventive concepts.
Figure 5B:
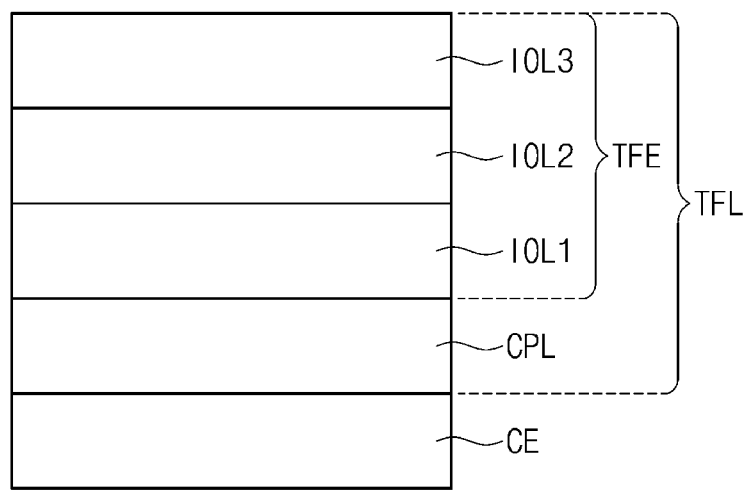
FIG. 5B is an enlarged cross-sectional view of an upper insulation layer according to an exemplary embodiment of the inventive concepts.

FIG. 4 is a plan view of a display panel DP according to an exemplary embodiment of the inventive concepts. FIG. 5A is an enlarged cross-sectional view of the display panel DP according to an exemplary embodiment of the inventive concepts. FIG. 5B is an enlarged cross-sectional view of an upper insulation layer TFL according to an exemplary embodiment of Insulation layer. The display panel DP of FIG. 5A is illustrated based on the display panel DP of FIG. 3A.

As illustrated in FIG. 4, the display panel DP may include a driving circuit GDC, a plurality of signal lines SGL (hereinafter, referred to as signal lines), a plurality of signal pads DP-PD (hereinafter, referred to as signal pads), and a plurality of pixels PX (hereinafter, referred to as pixels). The display area DP-PA may be defined as an area on which the pixels PX are disposed. Each of the pixels PX includes an organic light emitting diode and a pixel driving circuit connected to the organic light emitting diode. The circuit element layer DP-CL of FIGS. 3A and 3B may include the driving circuit GDC, the signal lines SGL, the signal pads DP-PD, and a pixel driving circuit.

The driving circuit GDC may include a scan driving circuit. The scan driving circuit generates a plurality of scan signals (hereinafter, referred to as scan signals) to sequentially output the scan signals to a plurality of scan lines GL (hereinafter, referred to as scan lines) that will be described later. The scan driving circuit may further output other control signals to the driving circuit of each of the pixels PX.

The scan driving unit may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL includes scan lines GL, data lines DL, a power line PL, and a control signal line CSL. The scan lines GL are respectively connected to corresponding pixels of the pixels PX, and the data lines DL are respectively connected to corresponding pixels PX of the pixels PX. The power line PL is connected to the pixels PX. The control signal line CSL may provide control signals to the scan driving circuit.

The signal lines SGL overlap the display area DP-DA and the non-display area DP-NDA. The signal lines SGL may include a pad part and a line part. The line part overlaps the display area DP-DA and the non-display area DP-NDA. The pad part is disposed on an end of the line part. The pad part is disposed on the non-display area DP-NDA to overlap a corresponding signal pad of the signal pads DP-PD. An area of the non-display area NDA, on which the signal pads DP-PD are disposed, may be defined as a pad area DP-PA. The pad area DP-PA may be connected to a circuit board (not shown).

Substantially, the line part connected to the pixel PX may constitute most of the signal lines SGL. The line part is connected to the transistors T1 and T2 (see FIG. 5A) of the pixel PX. The line part may have a single/multilayered structure. The line part may be a single body or include two or more portions. The two or more portions may be disposed on layers different from each other and connected to each other a contact hole passing through the insulation layer disposed between the two portions.

FIG. 5A illustrates a partial cross-section of the display panel DP corresponding to the transistors T1 and T2 and the light emitting diode OLED. The circuit element layer DP-CL disposed on the base layer BL includes at least one insulation layer and a circuit element. The circuit element includes the signal line and the driver circuit of the pixel. The circuit element layer DP-CL may be formed through a process of forming an insulation, a semiconductor layer, and a conductive layer by coating or deposition and a process of patterning the insulation, the semiconductor layer, and the conductive layer by a photolithography process.

In this embodiment, the circuit element layer DP-CL may include a buffer layer BFL, a first inorganic layer 10, and a second inorganic layer 20, which are inorganic layers, and an organic layer 30. The buffer layer BFL may include a plurality of laminated inorganic layers. FIG. 5A illustrates an example of an arrangement relationship between a first semiconductor pattern OSP1, a second semiconductor pattern OSP2, a first control electrode GE1, a second control electrode GE2, a first input electrode DE1, a second output electrode SE1, a second input electrode DE2, and a second output electrode SE2, which constitute the switching transistor T1 and the driving transistor T2. First to fourth through-holes CH1 to CH4 are illustrated exemplarily.

The display element layer DP-OLED may include an organic light emitting diode OLED. The display element layer DP-OLED includes a pixel defining layer PDL. For example, the pixel defining layer PDL may be an organic layer.

A first electrode AE is disposed on the organic layer 30. The first electrode AE is connected to the second output electrode SE2 through the fifth through-hole CH5 passing through the organic layer 30. An opening OP is defined in the pixel defining layer PDL. The opening OP of the pixel defining layer PDL exposes at least a portion of the first electrode AE. The opening OP of the pixel defining layer PDL is called as a light emitting opening to be distinguished from other openings.

As illustrated in FIG. 5A, the display area DP-DA may include an emission area PXA and a non-emission area NPXA adjacent to the emission area PXA. The non-emission area NPXA may surround the emission area PXA. In the current embodiment, the emission area PXA may be defined to correspond to a portion of an area of the first electrode AE exposed by the light emitting opening OP.

A hole control layer HCL may be commonly disposed on the emission area PXA and the non-emission area NPXA. The hole control layer HCL may include a hole transport layer and may further include a hole injection layer. The emission layer EML is disposed on the hole control layer HCL. The emission layer EML may be disposed on an area corresponding to the light emitting opening OP. That is, the emission layer EML may be formed to be separated from each of the pixels PX. Also, the emission EML may include an organic material and/or an inorganic material. The emission layer EML may generate light having a predetermined color.

An electronic control layer ECL is disposed on the emission layer EML. The electron control layer ECL may include an electron transport layer and may further include an electron injection layer. The hole control layer HCL and the electron control layer ECL may be formed commonly formed on the plurality of pixels by using an open mask. A second electrode CE is disposed on the electronic control layer ECL. The second electrode CE is provided as a single body and commonly disposed on the plurality of pixels.

As illustrated in FIGS. 5A and 5B, the upper insulation layer TFL is disposed on the second electrode CE. The upper insulation layer TFL may include a plurality of thin films. According to this embodiment, the upper insulation layer TFL may include a capping layer CPL and a thin film encapsulation layer TFE. The thin film encapsulation layer TFE may include a first inorganic layer IOL1, an organic layer OL, and a second inorganic layer IOL2.

The capping layer CPL is disposed on the second electrode CE to contact the second electrode CE. The capping layer CPL may include an organic material. The first inorganic layer IOL1 is disposed on the capping layer CPL to contact the capping layer CPL. The organic layer OL is disposed on the first inorganic layer IOL1 to contact the first inorganic layer IOL1. The second inorganic layer IOL2 may be disposed on the organic layer OL to contact the organic layer OL.

The capping layer CPL may protect the second electrode CE from a follow-up process, for example, a sputtering process and improve emission efficiency of the organic light emitting diode OLED. The capping layer CPL may have a refractive index greater than that of the first inorganic layer IOL1.

The first inorganic layer IOL1 and the second inorganic layer IOL2 may protect the display element layer DP-OLED from oxygen/moisture, and the organic layer may protect the display element layer DP-OLED from foreign substances such as dust particles. Each of the first inorganic layer IOL1 and the second inorganic layer IOL2 may be one of a silicon oxide layer, a silicon nitride layer, a silicon oxynitride layer, and a silicon oxide layer. According to an exemplary embodiment, each of the first inorganic layer IOL1 and the second inorganic layer IOL2 may include a titanium oxide layer, an aluminum oxide layer, and the like. The organic layer OL may include an acrylic-based organic layer, but is not limited thereto.

According to an exemplary embodiment of the inventive concepts, an inorganic layer, for example, an LiF layer may be further disposed between the capping layer CPL and the first inorganic layer IOL1. The LiF layer may improve the emission efficiency of the light emitting element OLED.

Figure 6A:
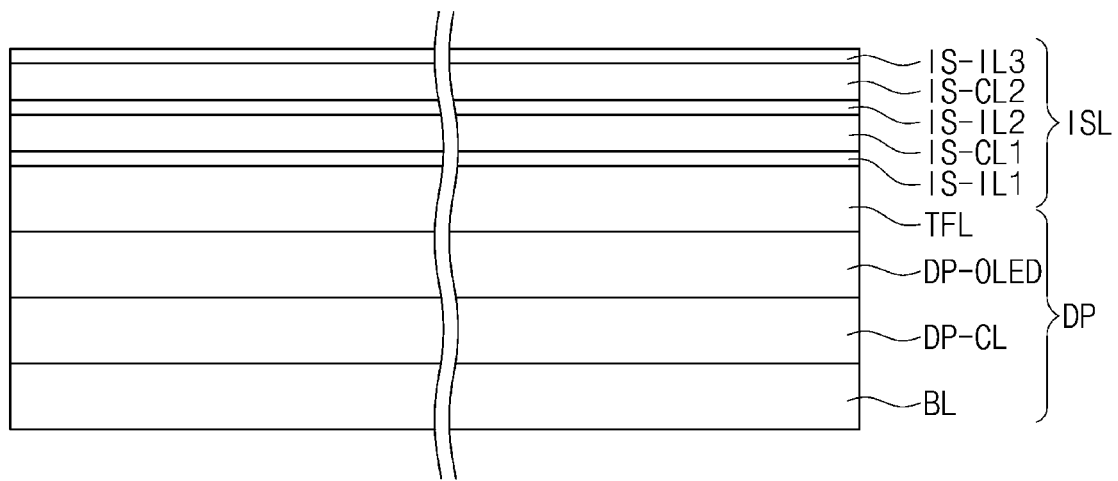
FIG. 6A is a cross-sectional view of an input sensing layer according to an exemplary embodiment of the inventive concepts.
Figure 6B:
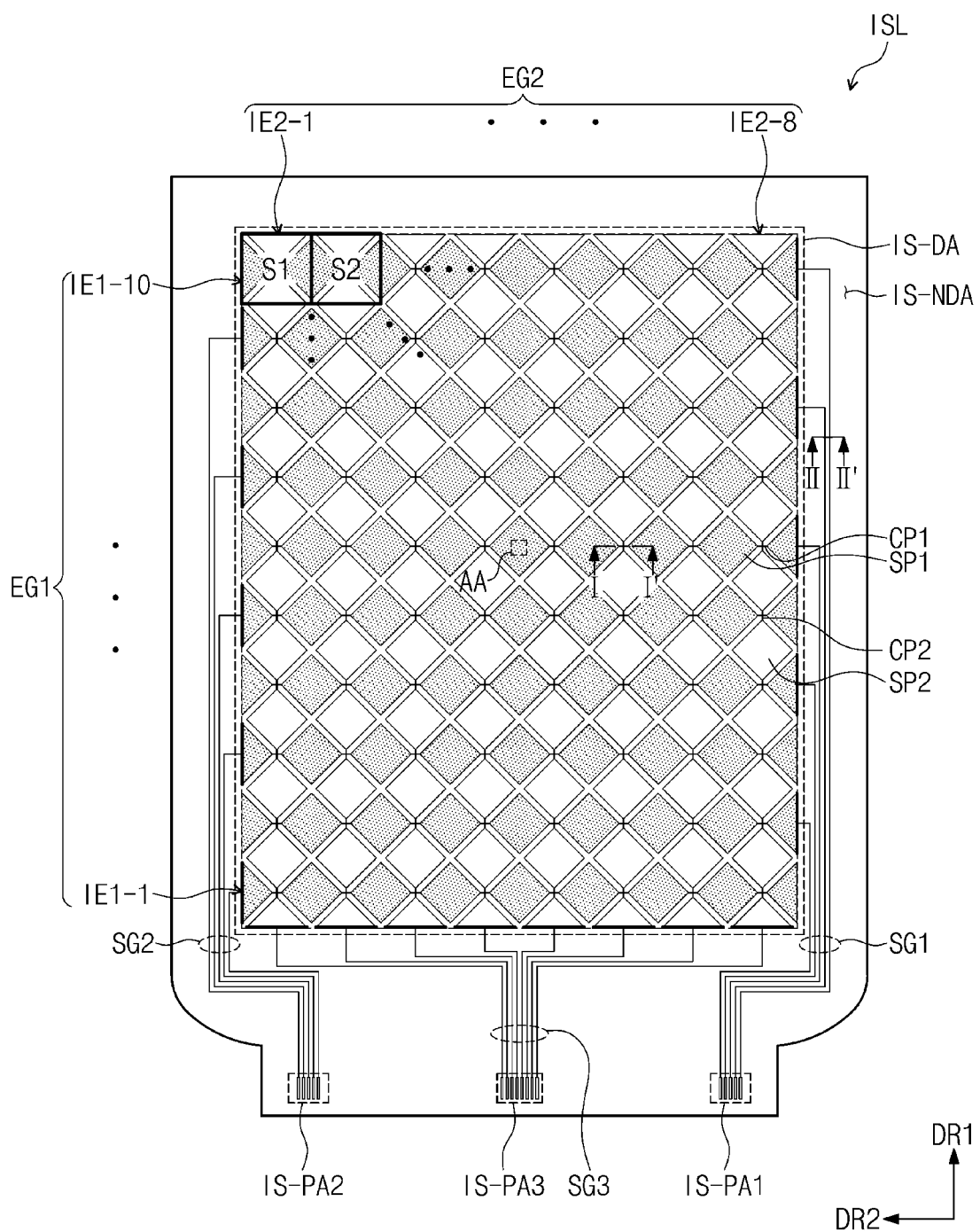
FIG. 6B is a plan view of the input sensing layer according to an exemplary embodiment of the inventive concepts.

FIG. 6A is a cross-sectional view of an input sensing layer ISL according to an exemplary embodiment of the inventive concepts. FIG. 6B is a plan view of the input sensing layer ISL according to an exemplary embodiment of the inventive concepts. FIGS. 6D and 6E are partial cross-sectional views of the input sensing layer ISL according to an exemplary embodiment of the inventive concepts. FIG. 6E is an enlarged plan view of an area AA of FIG. 6B. FIG. 6F is a plan view of the input sensing layer according to an exemplary embodiment of the inventive concepts. The input sensing layer ISL that will be described below may be equally applied to the input sensing layer ISP (see FIG. 2B).

As illustrated in FIG. 6A, the input sensing layer ISL may include a first insulation layer IS-IL1, a second conductive layer IS-CL1, a second insulation layer IS-IL2, a second conductive layer IS-CL2, and a third insulation layer IS-IL3. The first insulation layer IS-IL1 may be directly disposed on the upper insulation layer TFL. In an exemplary embodiment of the inventive concepts, the first insulation layer IS-IL1 may be omitted. In FIG. 6A, the display panel DP is schematically illustrated.

Each of the first conductive layer IS-CL1 and the second conductive layer IS-CL2 may have a single-layer structure or a multi-layer structure in which a plurality of layers are stacked in the third directional axis DR3. The conductive layer having the multilayer structure may include at least two of the transparent conductive layers and the metal layers. The conductive layer having the multilayer structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may be formed of molybdenum, silver, titanium, copper, aluminum, and an alloy thereof. For example, each of the first and second conductive layers IS-CL1 and IS-CL2 may have a three-layered metal structure, for example, a three-layered structure of titanium/aluminum/titanium.

Each of the first and second conductive layers IS-CL1 and IS-CL2 may include a plurality of conductive patterns. Hereinafter, an example in which the first conductive layer IS-CL1 includes first conductive patterns, and the second conducive layer IS-CL2 includes second conductive patterns will be described. Each of the first and second conductive patterns may include sensing electrodes and signal lines connected to the sensing electrodes.

Each of the first and second insulation layers IS-IL1 and IS-IL2 may include an inorganic or organic material. In this embodiment, each of the first and second insulation layers IS-IL1 and IS-IL2 may be an inorganic layer including an inorganic material. The inorganic layer may include at least one of oxide, titanium oxide, silicon oxide, silicon oxide nitride, zirconium oxide, or hafnium oxide. The third insulation layer IS-IL3 may include an organic material. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

As illustrated in FIG. 6B, the input sensing layer ISL may include a sensing area IS-DA and a line area IS-NDA, which correspond to the display area DP-DA and the non-display area DP-NDA of the display panel DP. The sensing area IS-DA may be defined as an area on which a first electrode group EG1 and a second electrode group EG2, which will be described later.

The input sensing layer ISL may include a first electrode group EG1, a second electrode group EG2, a first signal line group SG1 electrically connected to a corresponding electrode of the first electrode group EG1, a second signal line group SG2 electrically connected to the other electrode of the first electrode group EG1, and a third signal line group SG3 electrically connected to the second electrode group EG2. The first signal line group SG1, the second signal line group SG2, and the third signal line group SG3 are disposed on the line area IS-NDA.

In this embodiment, the input sensing layer ISL may be a capacitive touch sensor that senses an external input in a mutual cap manner. One of the first electrode group EG1 and the second electrode group EG2 may receive a detection signal, and the other one may output a variation in capacitance between the first electrode group EG1 and the second electrode group EG2 as an output signal.

The first electrode group EG1 includes a plurality of first sensing electrodes. The first electrode group EG1 includes 1th to i-th (where i is a natural number of 2 or more) is electrode. The first electrode group EG1 including the ten electrodes IE1-1 to 1E-1-10 are illustrated as an example. The 1-th to 10-th electrodes IE1-1 to IE1-10 may extend in the second direction DR2. The 1-th to 10-th electrodes IE1-1 to IE1-10 are arranged in a direction that is away from the pad areas IS-PA1, IS-PD2, and IS-PD3 in the first direction DR1.

The second electrode group EG2 includes a plurality of second sensing electrodes. The second electrode group EG2 includes 1-th to j-th (where j is a natural number of 2 or more) electrode. The second electrode group EG2 including the eight electrodes IE2-1 to 1E-2-8 are illustrated as an example. The 1-th to 8-th electrode IE2-1 to IE2-8 cross the 1-th to 10-th electrodes IE1-1 to IE1-10. The 1-th to 8-th electrodes IE2-1 to IE2-8 may extend in the first direction DR1.

The first signal line group SG1 includes first signal lines. The first signal line group SG1 includes 1-th to k-th (where k is the largest natural number of the natural numbers equal to or less than i/2) line signals. In this embodiment, the first signal line group SG1 includes five first signal lines.

The 1-th to k-th signal lines may be sequentially connected to odd-numbered electrodes or even-numbered electrodes of the 1-th to i-th (where i is a natural number of 2 or more) electrodes. In this embodiment, five first signal lines are respectively connected to even-numbered electrode of ten electrodes IE1-1 to IE1-10. In FIG. 6B, the five first signal lines are respectively connected to right ends of the even-numbered electrodes.

The second signal line group SG2 includes second signal lines. The second signal line group SG2 includes 1-th to k-th (where k is the largest natural number of the natural numbers equal to or less than i/2) line signals. In this embodiment, the second signal line group SG2 includes five second signal lines. In this embodiment, the five second signal lines are respectively connected to odd-numbered electrodes of ten electrodes IE1-1 to IE1-10. The second signal lines are respectively connected to left ends of the odd-numbered electrodes. That to say, when the first signal lines are connected to one of the corresponding electrode, the second signal lines may be connected to the other side of the corresponding electrode.

The third signal line group SG3 includes third signal lines. The third signal lines are respectively connected to 1-th to j-th electrodes of the second electrode group EG2. Eight third signal lines respectively connected to lower ends of the 1-th to 8-th electrodes IE2-1 to IE2-8 are illustrated as an example.

A portion of the signal lines may be disposed on the first pad area IS-PA1, a portion of the signal lines may be disposed on the second pad area IS-PA2, and a portion of the signal lines is disposed on the third pad area IS-PA3.

Each of the electrodes of the first electrode group EG1 includes a plurality of first sensing parts SP1 and a plurality of connection parts CP1. The first sensing parts SP1 are arranged in the second direction DR2. Each of the first connection parts connects two first sensing parts SP1, which are adjacent to each other, of the first sensing parts SP1.

Each of the electrodes of the second electrode group EG2 includes a plurality of second sensing parts SP2 and a plurality of second connection parts CP2. The second sensing parts SP2 are arranged in the first direction DR1. Each of the second connection parts CP2 connects two second sensing parts SP2, which are adjacent to each other, of the second sensing parts SP2.

The electrodes of the first electrode group EG1 and the second electrode group EG2 are insulated from each other. FIG. 6B illustrates an example in which the first connection part CP1 and the second connection part CP2 cross each other. Portions of the plurality of first sensing parts SP1, the plurality of first connection parts CP1, the plurality of second sensing parts SP2, and the plurality of second connection parts CP2 may be formed by patterning the first conductive layer IS-CL1 of FIG. 6A, and other portions may be formed by patterning the second conductive layer IS-CL2 of FIG. 6A.

Referring to FIG. 6B, at least a portion of an area of the sensing area IS-DA may be divided into a plurality of first sensing areas S1 and a plurality of second sensing areas S2, which are alternately disposed. According to this embodiment, the entire sensing area IS-DA is divided into the first sensing areas S1 and the second sensing areas, but is not limited thereto.

The plurality of first sensing areas S1 and the plurality of second sensing areas S2 have the same surface area. Each of the plurality of first sensing areas S1 and the plurality of second sensing areas S2 includes a corresponding crossing area between the electrodes IE1-1 to IE1-10 of the first electrode group EG1 and the electrodes IE2-1 to IE2-8 of the second electrode group EG2. The crossing area is an area disposed adjacent to the first connection part CP1 and the second connection part CP2.

Figure 6C:
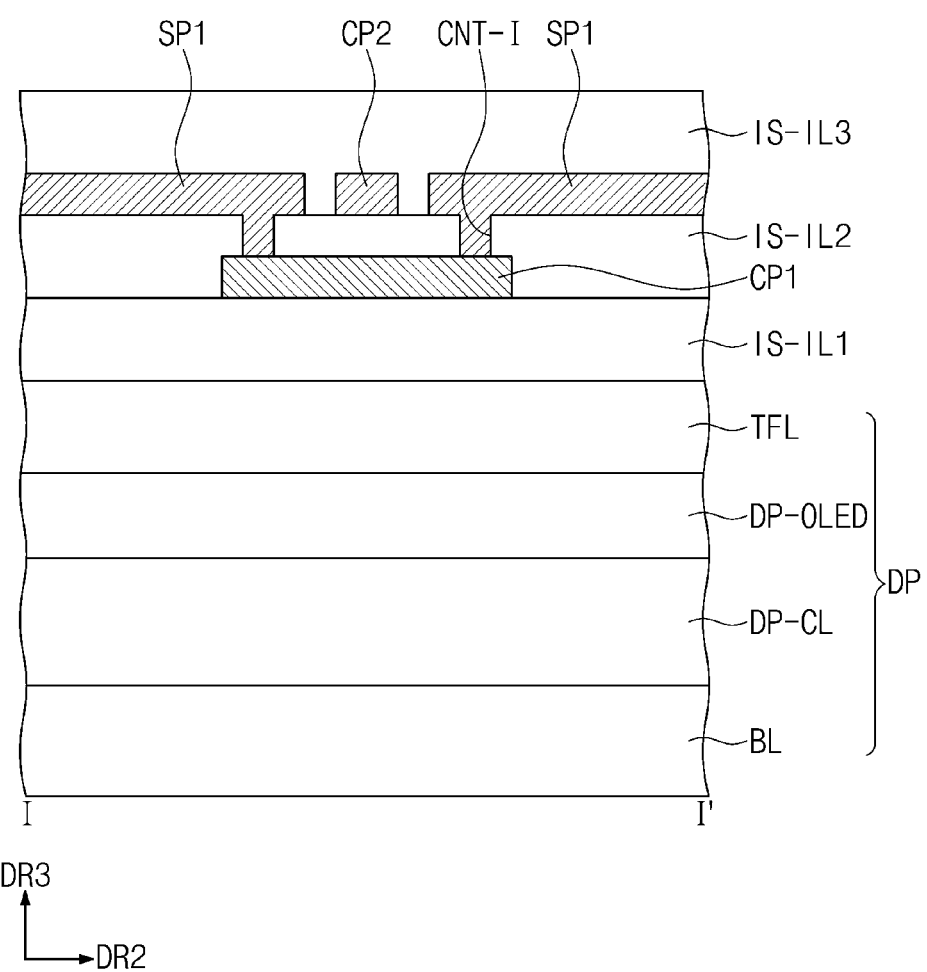
FIGS. 6C and 6D are partial cross-sectional views of the input sensing layer according to an exemplary embodiment of the inventive concepts.
Figure 6D:
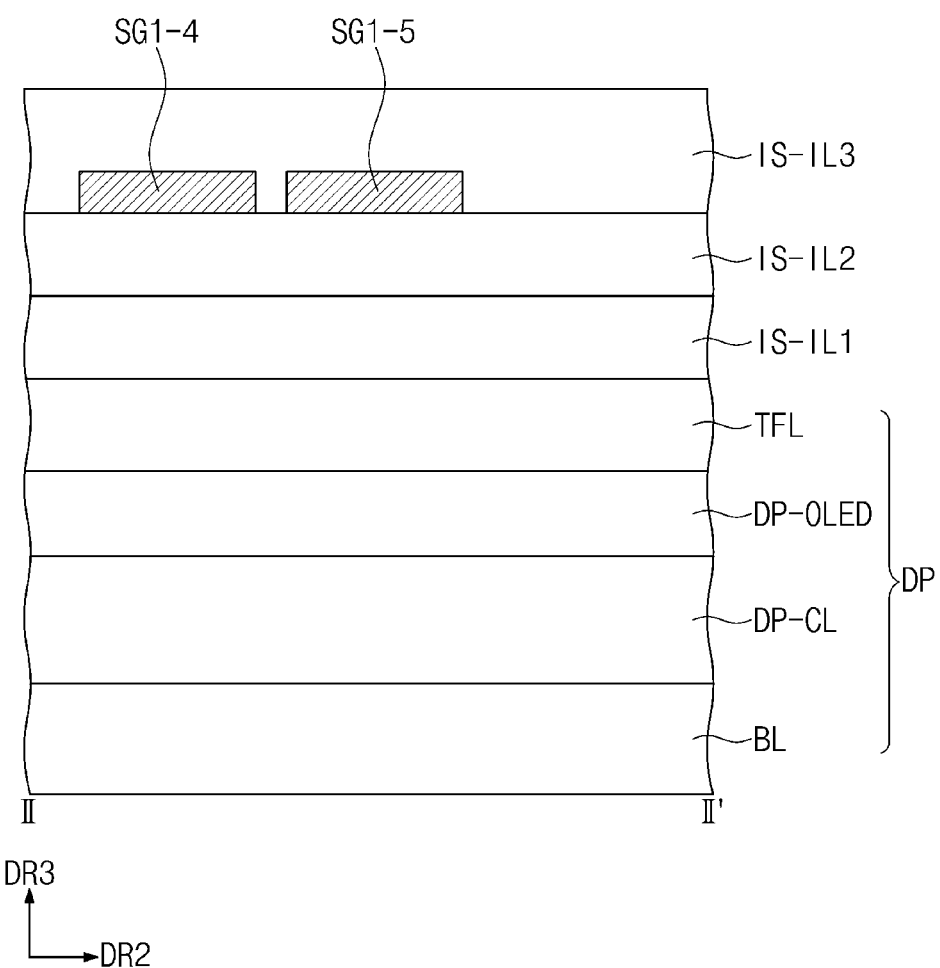
Figure 6E:
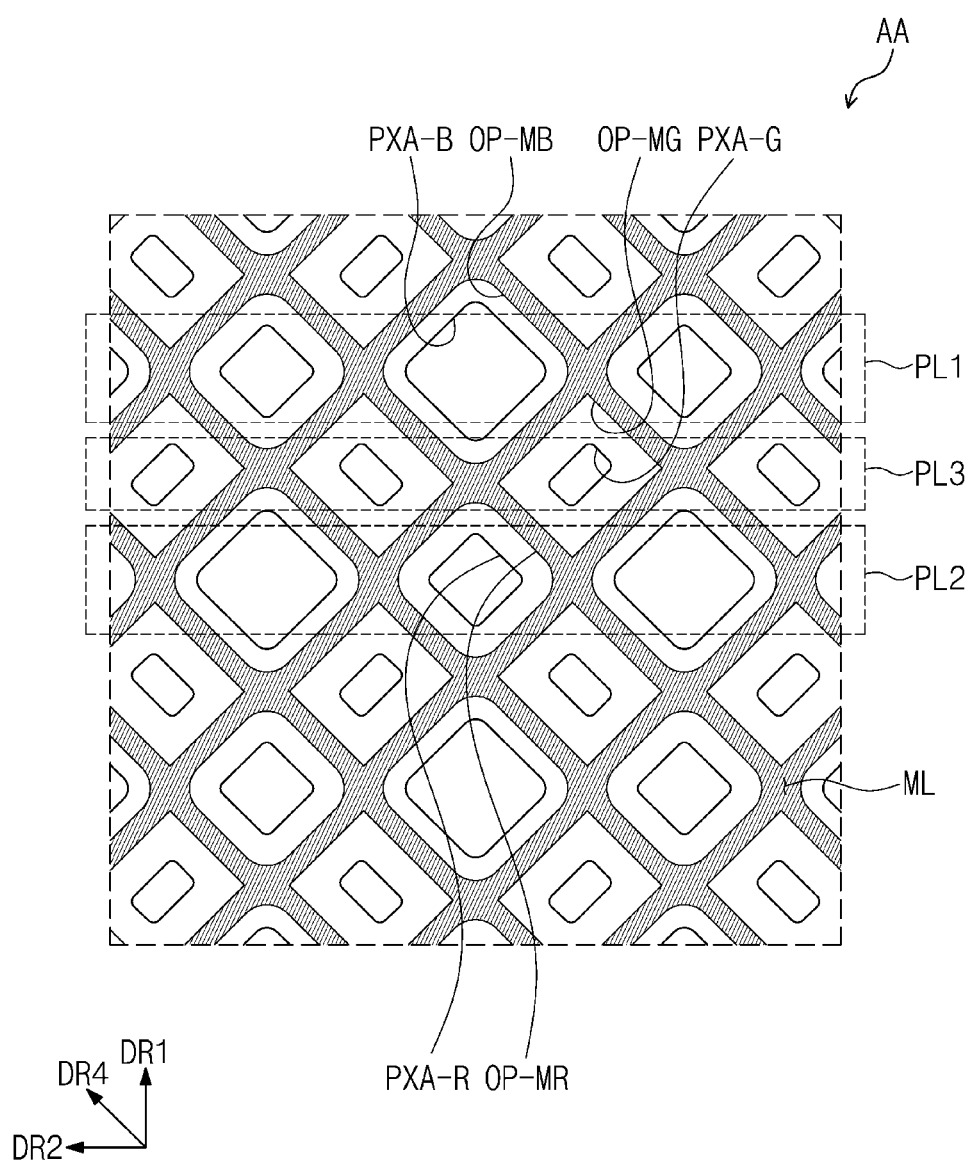
FIG. 6E is an enlarged plan view of an area AA of FIG. 6B.
Figure 6F:
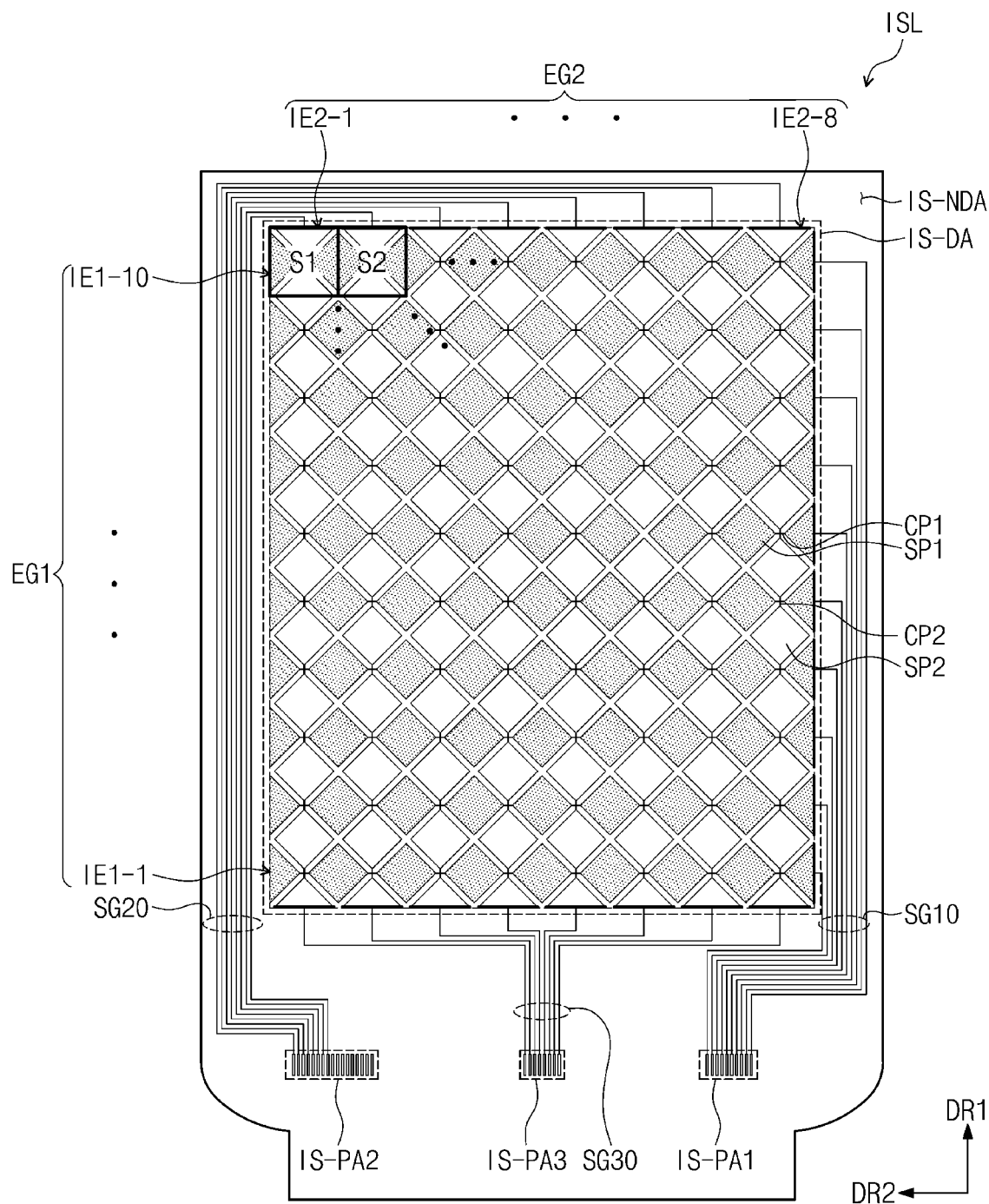
FIG. 6F is a plan view of the input sensing layer according to an exemplary embodiment of the inventive concepts.

As illustrated in FIG. 6C, the plurality of first connection parts CP1 may be formed from the first conductive layer IS-CL1, and the plurality of first sensing parts SP1, the plurality of second sensing parts SP2, and the plurality of second connection parts CP2 may be formed from the second conductive layer IS-CL2. The first sensing parts SP1 and the first connection part CP1 may be connected to each other through contact holes CNT-I passing through the second insulation layer IS-IL2. In this embodiment, the first connection part CP1 disposed on a layer different from those of the first sensing parts SP1 and the second sensing parts SP2 may be defined as a bridge pattern.

In this embodiment, although the plurality of first connection parts CP1 and the plurality of second connection parts CP2 cross each other, exemplary embodiments of the inventive concepts are not limited thereto. For example, each of the first connection parts CP1 may be deformed into a "∧"-shaped curved line and/or a "∨"-shaped curved line so that the first connection parts CP1 do not overlap the second connection parts CP2. The first connection parts CP1 having the "∧"-shaped curved line and/or a "∨"-shaped curved line may overlap the second sensing part SP2 on a plane.

The first signal line group SG1, the second signal line group SG2, and the third signal line group SG3 may be formed from the second conductive layer IS-CL2 (see FIG. 6A). Two signal lines SG1-4 and SG1-5 of the first signal line group SG1 formed from the second conductive layer IS-CL2 are illustrated in FIG. 6D. Although not separately shown, the first signal line group SG1, the second signal line group SG2, and the third signal line group SG3 may further include line parts formed from the second conductive layer IS-CL2 (see FIG. 6A). The line part formed from the second conductive layer IS-CL2 and the line part formed from the first conductive layer IS-CL1 may be connected to each other through contact holes passing through the second insulation layer IS-IL2.

FIG. 6E illustrates an arrangement relationship between a first emission area PXA-R, a second emission area PXA-B, and a third emission area PXA-G of the display panel DP (see FIG. 6A). The first emission area PXA-R, the second emission area PXA-B, and the third emission area PXA-G of the display panel DP may be equally defined as the emission area PXA described with reference to FIG. 5A.

In this embodiment, the first emission area PXA-R, the second emission area PXA-B, and the third emission area PXA-G may have surface areas different from each other. The first emission area PXA-R may have a first surface area, the second emission area PXA-B may have a second surface area, and the third emission area PXA-G may have a third surface area. The third emission areas PXA-G may include two types of emission areas different from each other. The first type third emission area PXA-G and the second type third emission area PXA-G may have the same surface area but have different shapes on the plane. The first type third emission area PXA-G may have a shape in which the second type third emission area PXA-G rotates at an angle of about 90 degree on the plane. The first type third emission areas PXA-G and the second type third emission areas PXA-G may be alternately disposed in the second direction DR2.

In FIG. 6E, the electrodes IE1-1 to IE1-10 of the first electrode group EG1 and the electrodes IE2-1 to IE2-8 of the second electrode group EG2 may have a mesh shape. FIG. 6E illustrates an enlarged view of an area AA of the first sensing part SP1 of FIG. 6B.

The first sensing part SP1 includes a mesh line ML defining first openings OP-MR having a first surface area, second openings OP-MB having a second surface area different from the first surface area, and third openings OP-MG having a third surface area different from each of the first and second surface areas. A comparison relationship between the surface areas of the first openings OP-MR, the second openings OP-MB, and the third openings OP-MG may correspond to that between the surface areas of the first emission areas PXA-R, the second emission areas PXA-B, and the third emission areas PXA-G, but is not limited to the same ratio.

The third openings OP-MG may include two types of openings different from each other. The first type third openings OP-MG and the second type third openings OP-MG may have shapes different from each other on the plane.

The plurality of pixels PX described with reference to FIG. 4 may include a red pixel generating red light, a blue pixel generating blue light, and a green pixel generating green light. In this embodiment, the first emission area PXA-R, the second emission area PXA-B, and the third emission area PXA-G may correspond to the red pixel, the blue pixel, and the green pixel, respectively.

Referring again to FIG. 6E, the first emission areas PXA-R, the second emission areas PXA-B, and the third emission areas PXA-G may define three types of emission area rows PL1, PL2, and PL3. Each of the first type emission area row PL1 and the second type emission area row PL2 may include the first emission areas PXA-R and the second emission areas PXA-B, which are alternately disposed. One of the first emission area PXA-R and the second emission area PXA-B is disposed on one row of the first type emission area row PL1, and the other of the first emission area PXA-R and the second emission area PXA-B is disposed on one row of the second type emission area row PL2.

The first type emission area row PL1 and the second type emission area row PL2 are alternately disposed in a column direction and the first direction DR1 in FIG. 6E. The third type emission area low PL3 is disposed between the first type emission area low PL1 and the second type emission area low PL2. The third type emission area low PL3 may include only the third emission areas PXA-G.

Referring to FIG. 6F, in the input sensing layer ISL according to this embodiment, a connection relationship of the first electrode group EG1 with respect to the input sensing layer ISL described with reference to FIG. 6B and a connection relationship of the signal line group with respect to the second electrode group EG2 are different from each other.

Right ends of the sensing electrodes IE1-1 to IE1-10 of the first electrode group EG1 are connected to the signal lines of the first signal line group SG10. Lower ends of the sensing electrodes IE2-1 to IE2-8 of the second electrode group EG2 are connected to the signal lines of the second signal line group SG20. Upper ends of the second sensing electrodes IE2-1 to IE2-8 are connected to the signal lines of the third signal line group SG30.

Figure 7A:
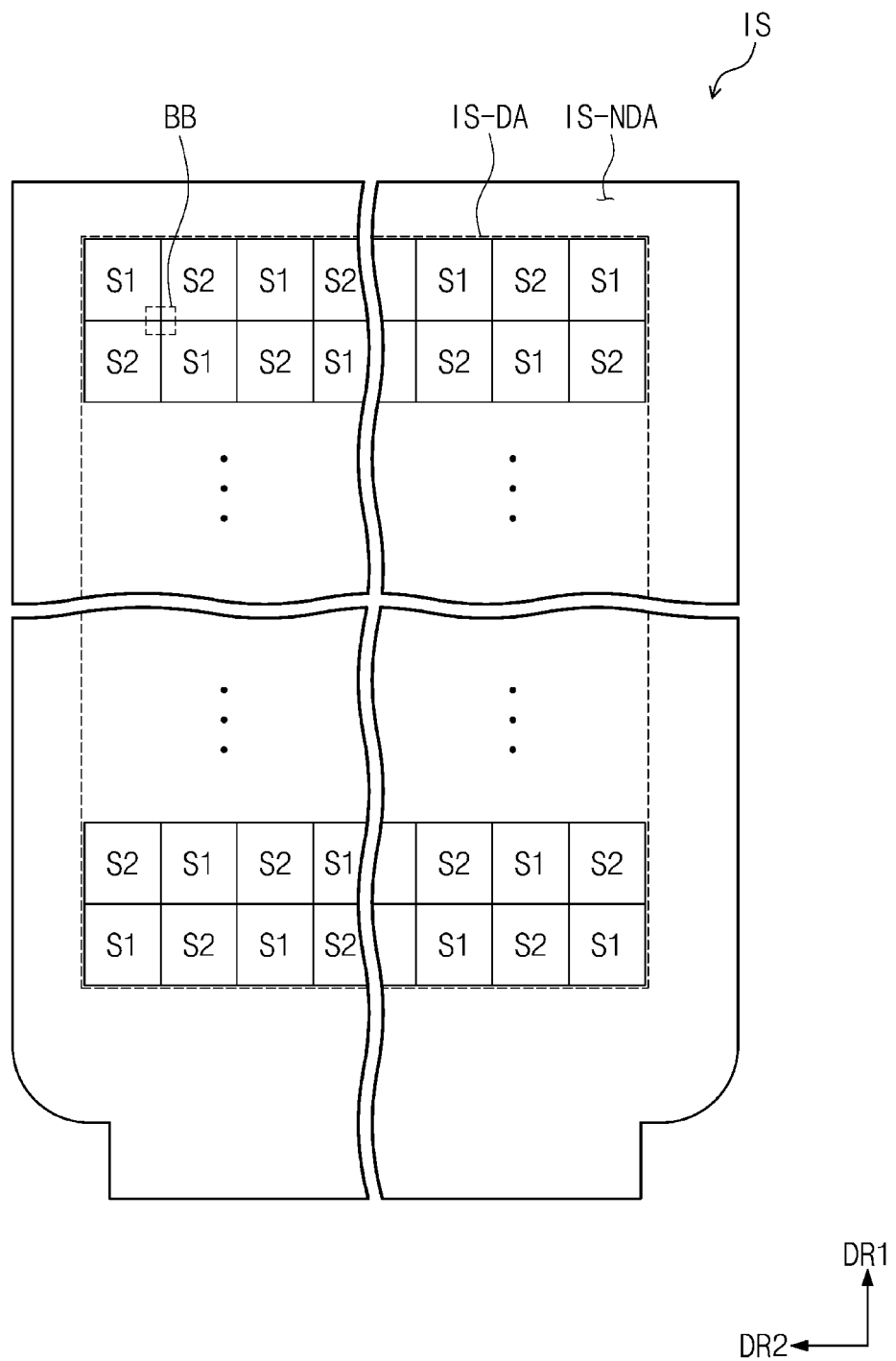
FIG. 7A is a plan view of an input sensor according to an exemplary embodiment is of the inventive concepts.
Figure 7B:
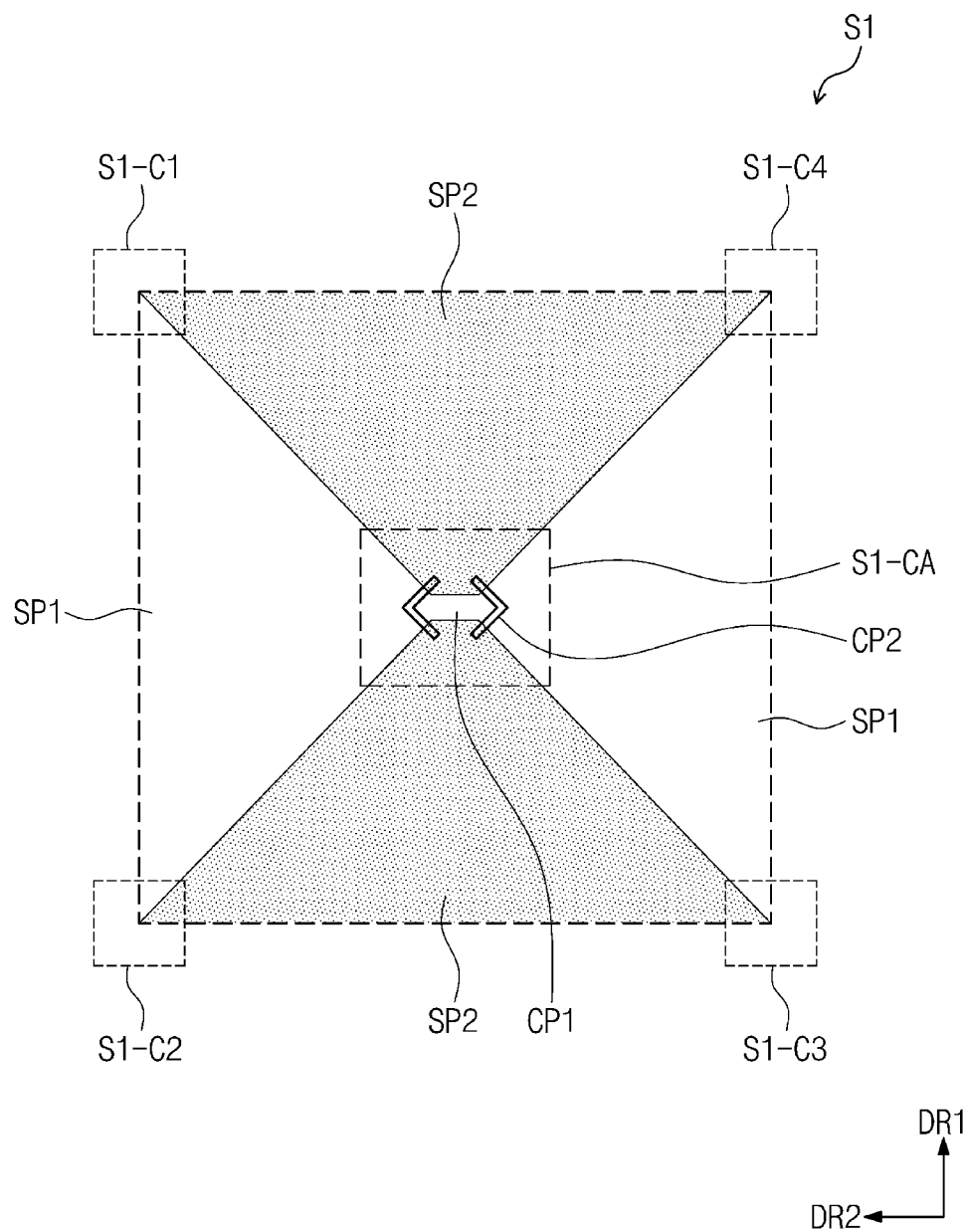
FIG. 7B is an enlarged plan view of a first sensing area of FIG. 7A.
Figure 7C:
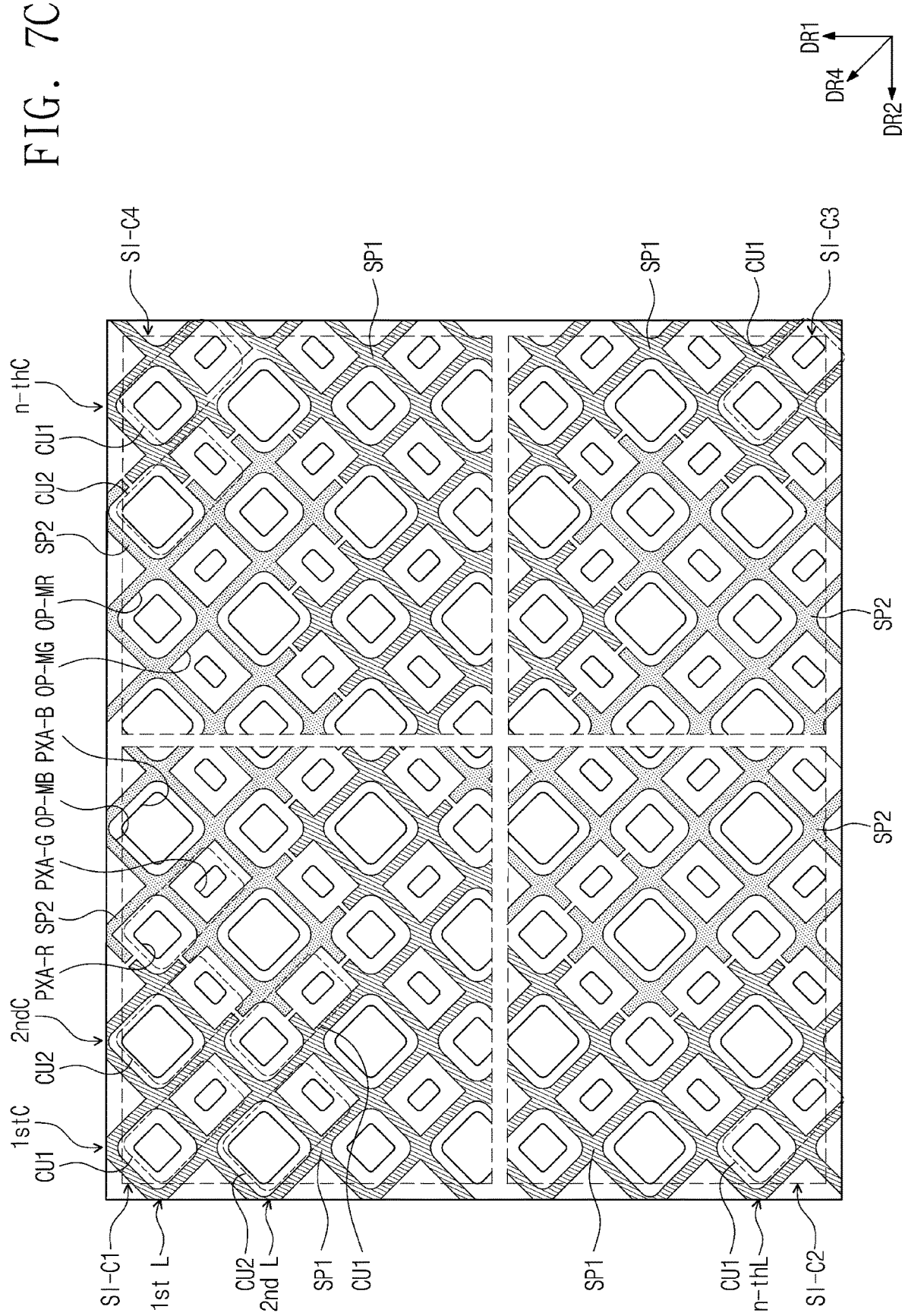
FIG. 7C is an enlarged plan view illustrating corner areas of the first sensing area of FIG. 7B.
Figure 7D:
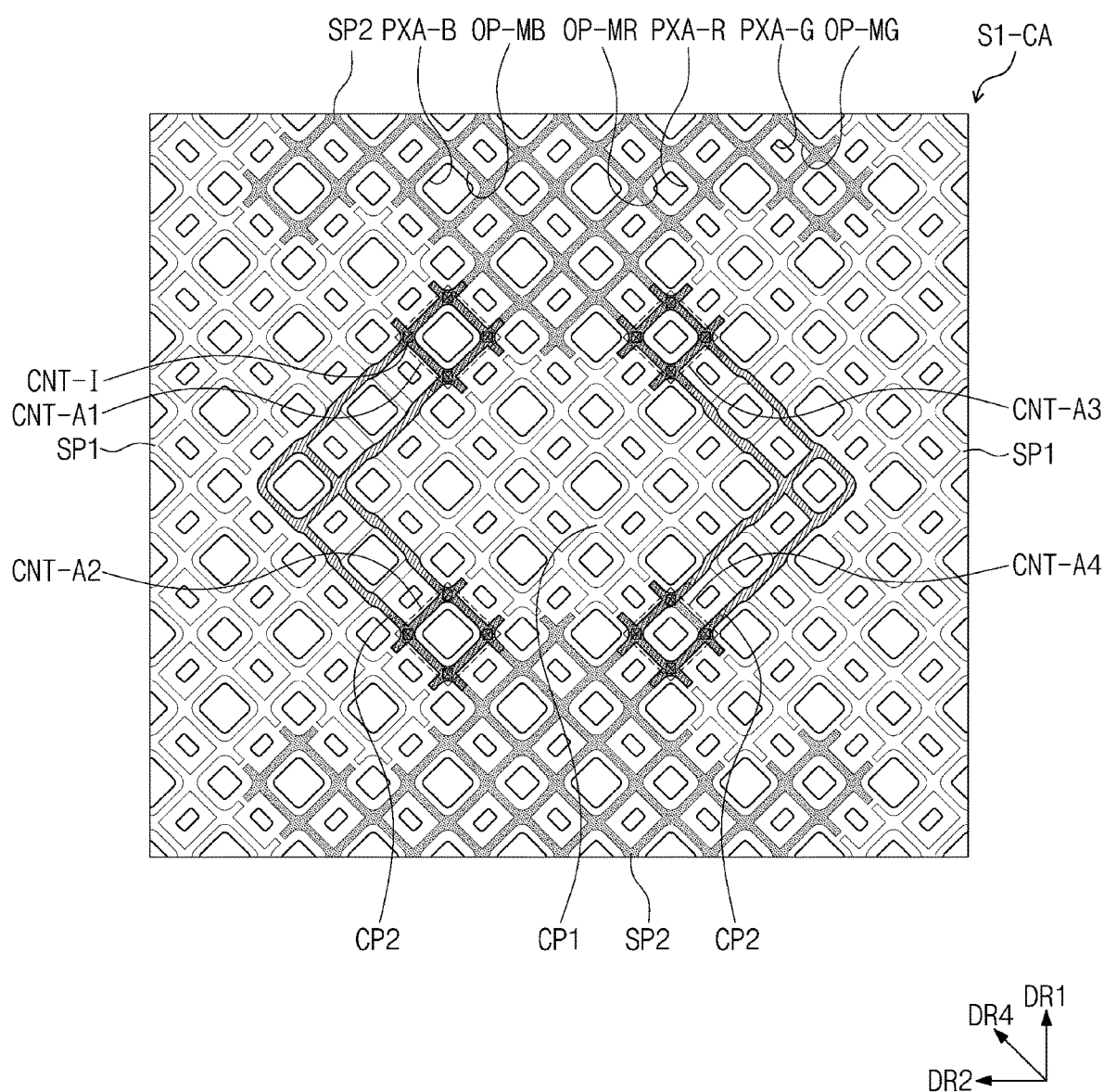
FIG. 7D is an enlarged plan view illustrating a crossing area of the first sensing area of FIG. 7B.
Figure 7E:
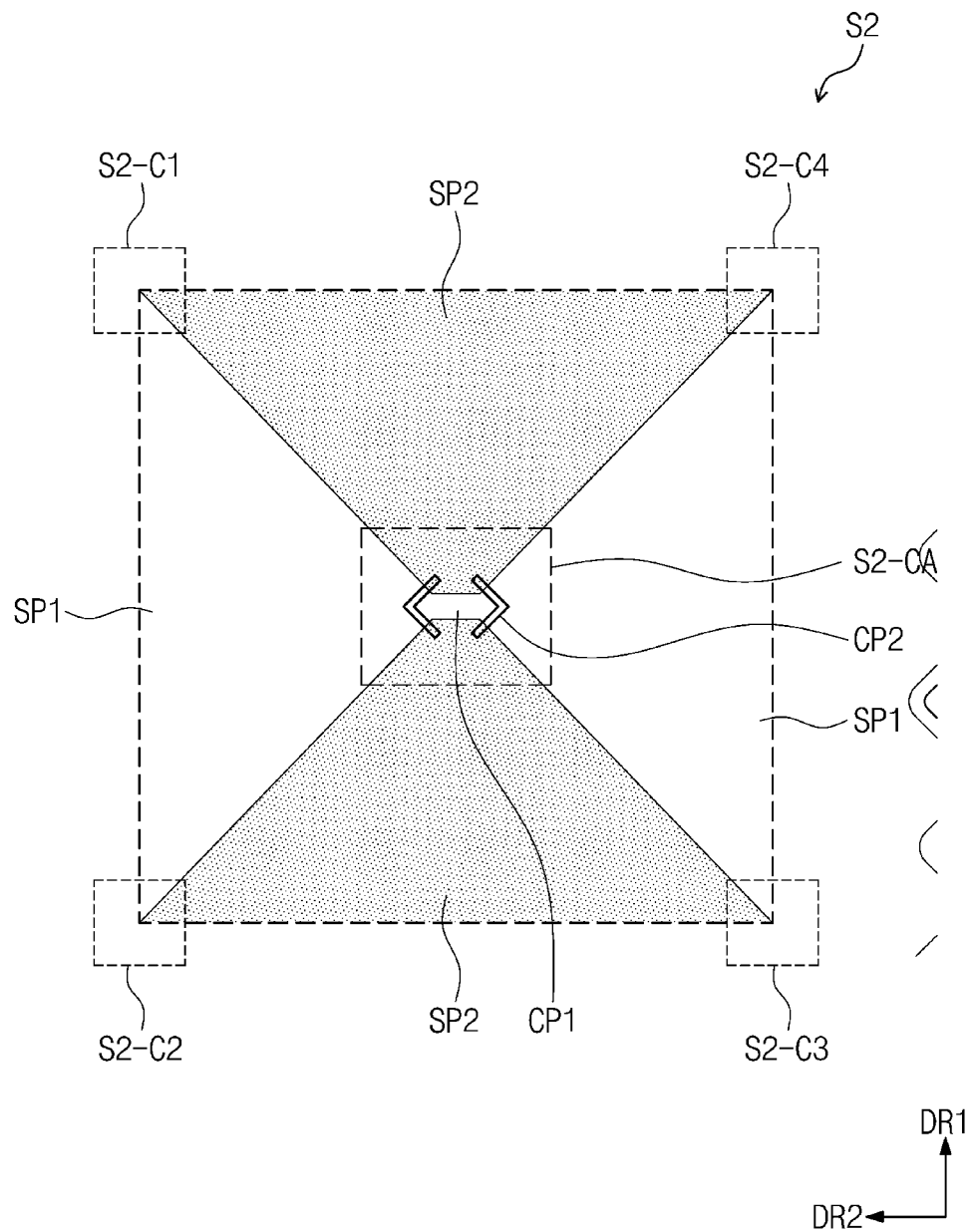
FIG. 7E is an enlarged plan view of a second sensing area of FIG. 7A.
Figure 7F:
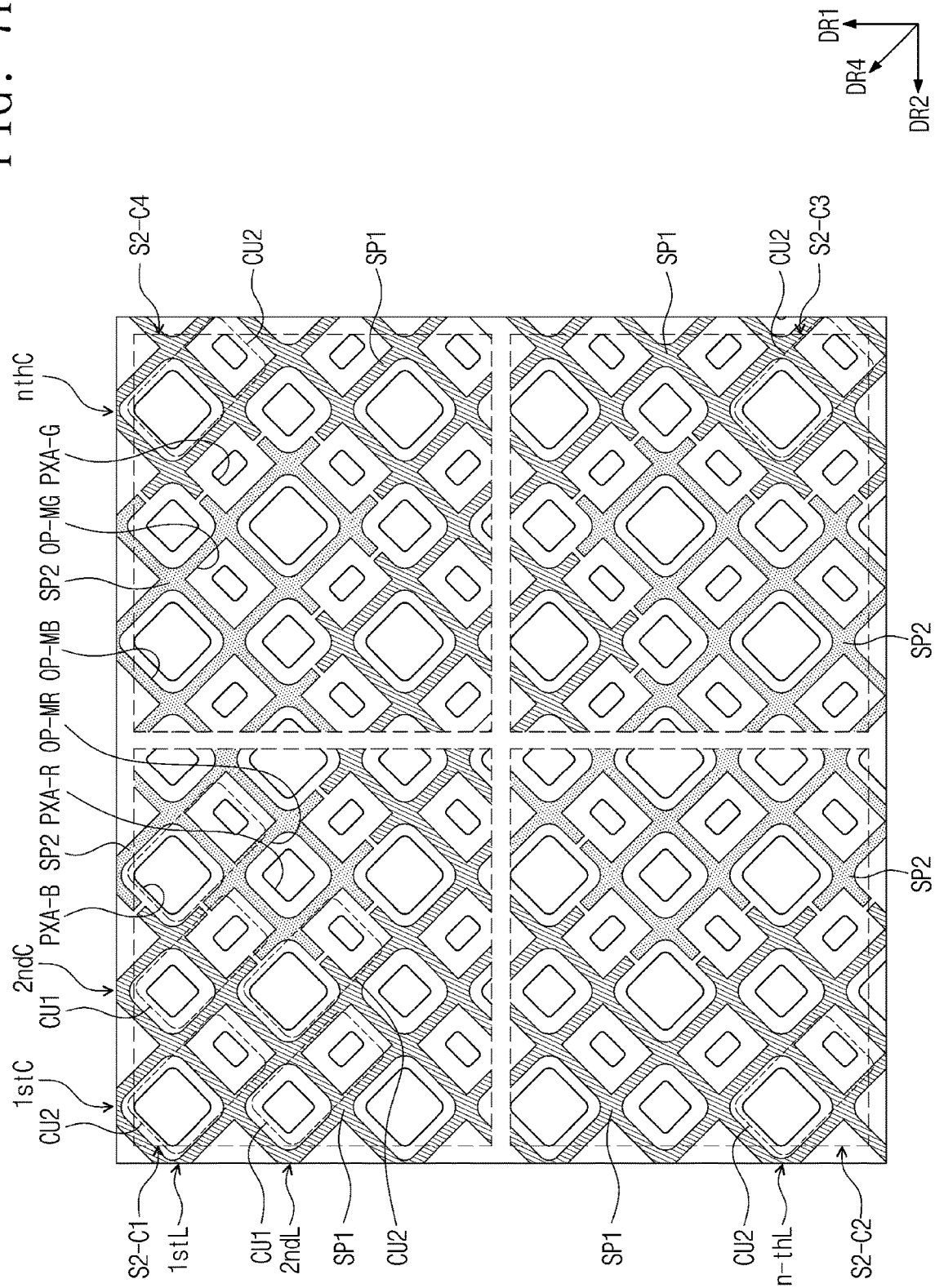
FIG. 7F is an enlarged plan view illustrating corner areas of the second sensing area of FIG. 7B.
Figure 7G:
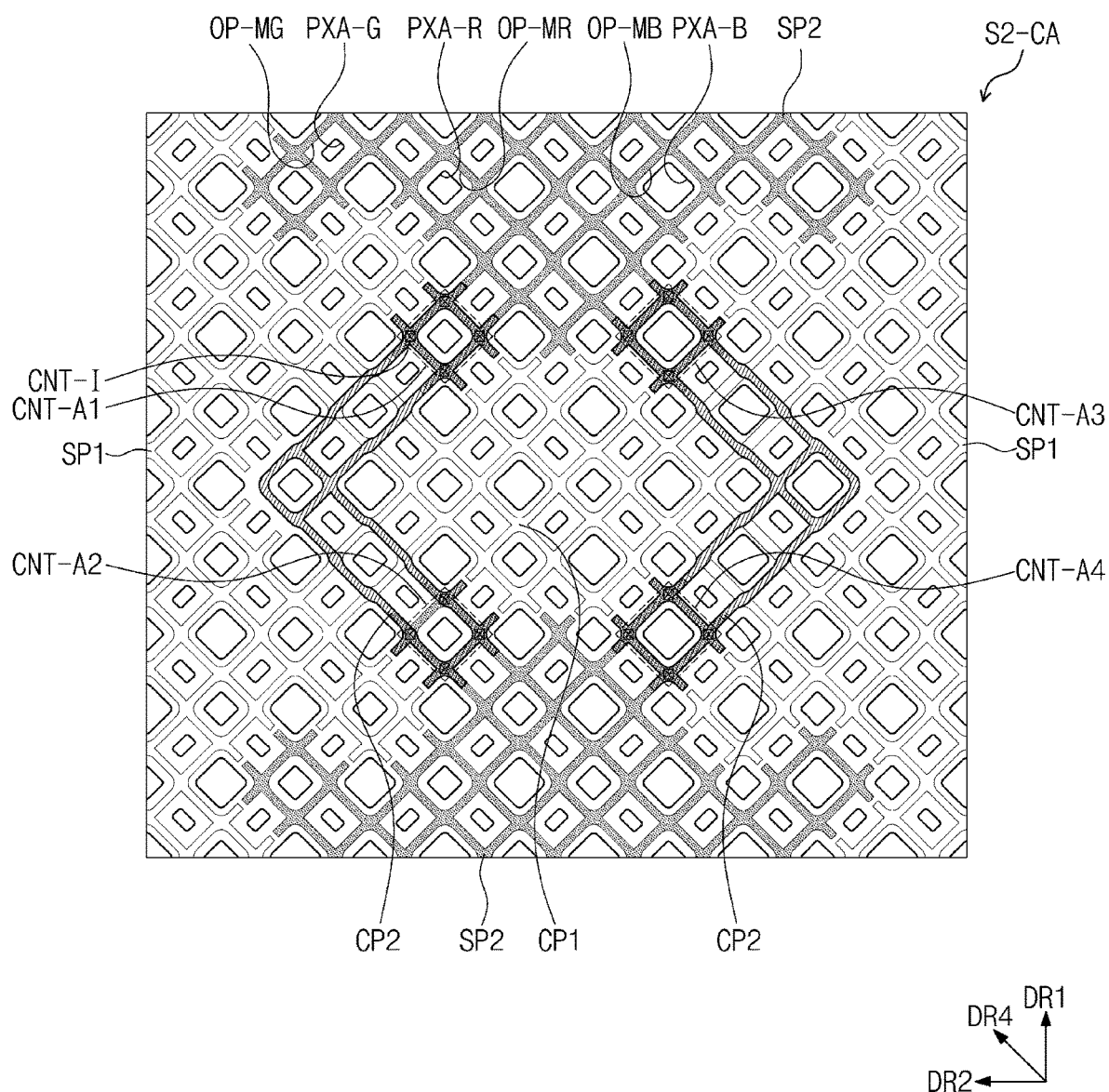
FIG. 7G is an enlarged plan view illustrating a crossing area of the second sensing area of FIG. 7B.
Figure 7H:
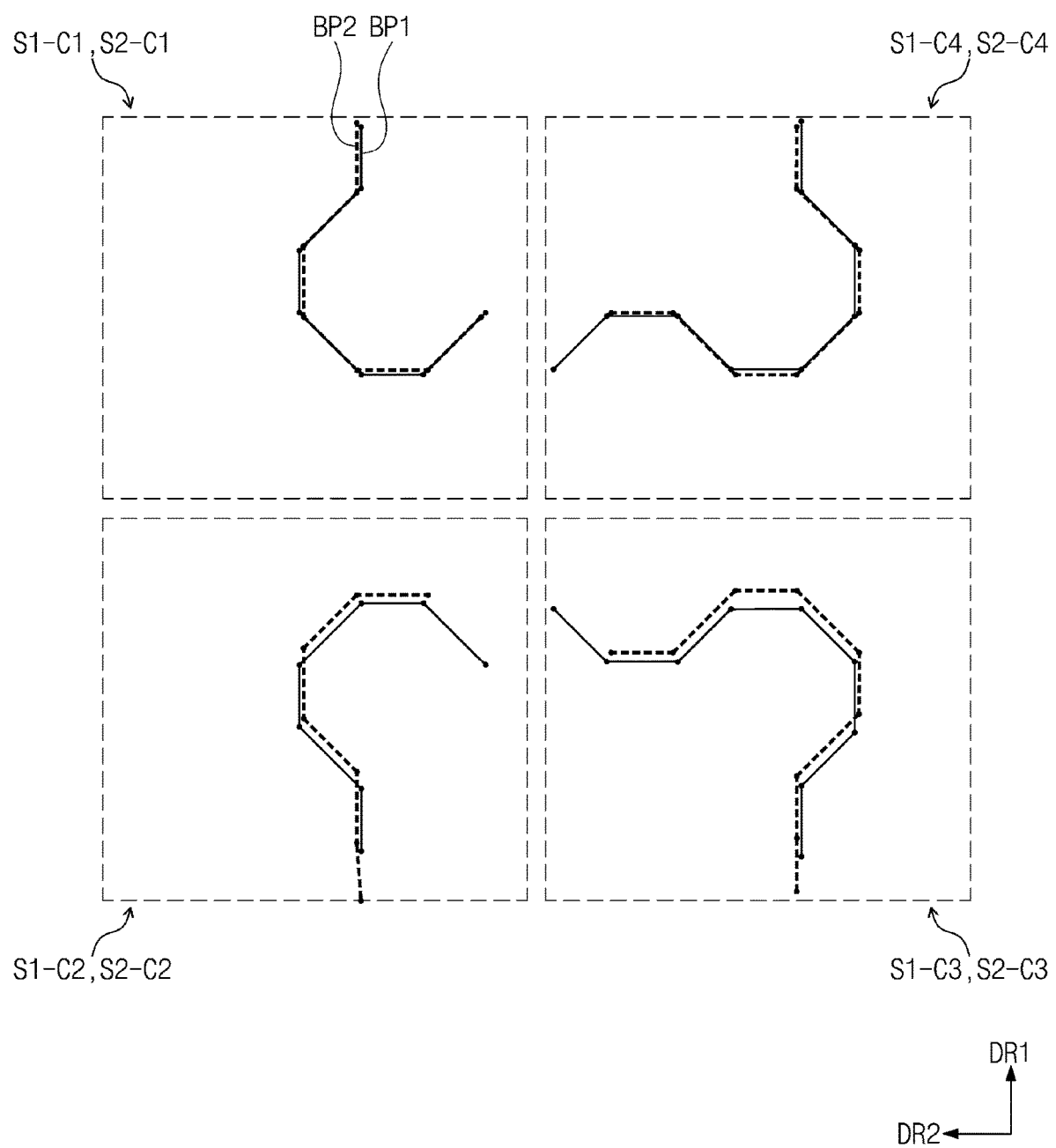
FIG. 7H is a view illustrating results obtained by comparing a first boundary pattern of the first sensing area with a second boundary pattern of the second sensing area.
Figure 7I:
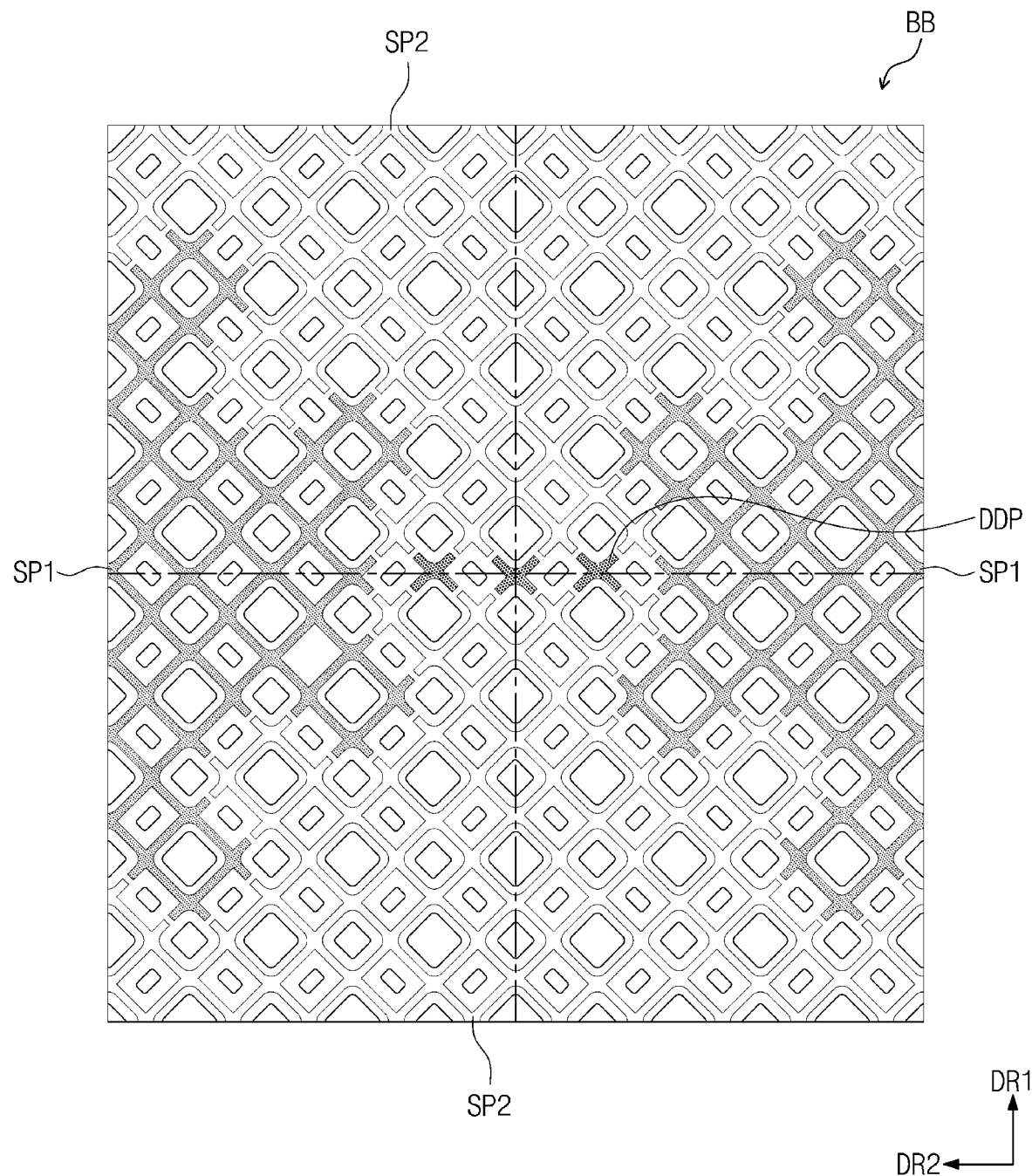
FIG. 7I is an enlarged plan view of an area BB of FIG. 7A.

FIG. 7A is a plan view of an input sensor IS according to an exemplary embodiment of the inventive concepts. FIG. 7B is an enlarged plan view of a first sensing area S1 of FIG. 7A. FIG. 7C is an enlarged plan view illustrating corner areas S1-C1 to S1-C4 of the first sensing area of FIG. 7B. FIG. 7D is an enlarged plan view illustrating a crossing area S1-CA of the first sensing area S1 of FIG. 7B. FIG. 7E is an enlarged plan view of a second sensing area S2 of FIG. 7A. FIG. 7F is an enlarged plan view illustrating corner areas of the second sensing area S2 of FIG. 7B. FIG. 7G is an enlarged plan view illustrating a crossing area of the second sensing area S2 of FIG. 7B. FIG. 7H is a view illustrating results obtained by comparing a first boundary pattern of the first sensing area with a second boundary pattern of the second sensing area. FIG. 7I is an enlarged plan view of an area BB of FIG. 7A. Hereinafter, detailed descriptions with respect to the same constituent as that described with reference to FIGS. 6A to 6F will be omitted.

Referring to FIG. 7A, the sensing area IS-DA may be divided into a plurality of first sensing areas S1 and a plurality of second sensing areas S2. The plurality of first sensing areas S1 and the plurality of second sensing areas S2 may be distinguished from each other by a virtual line. The plurality of first sensing areas S1 may be areas to which the same rule (hereafter, referred to as a first rule) is applied and be a portion of an area on which the first electrode group EG1 and the second electrode group EG2. The plurality of second sensing areas S2 may be areas to which the same rule (hereafter, referred, to as a second rule), which is different from the first rule, is applied and be a portion of an area on which the first electrode group EG1 and the second electrode group EG2.

The first sensing areas S1 and the second sensing areas S2, which are alternately disposed, may be arranged in a p×q matrix. Here, each of p and q are a natural number of 5 or more.

The first rule will be described with reference to FIGS. 7B to 7D. As illustrated in FIG. 7B, the first sensing area S1 includes a first connection part CP1, a half of a first sensing part SP1 disposed on one side of the first connection part CP1 in the second direction DR2, and another half of the first sensing part SP1 disposed on the other side of the first connection part CP1 in the second direction DR2. The first sensing area S1 includes a second connection part CP2, a half of a second sensing part SP2 disposed on one side of the second connection part CP2 in the first direction DR1, and another half of the second sensing part SP2 disposed on the other side of the second connection part CP2 in the first direction DR1. In this embodiment, the first sensing area S1 on which the two connection parts CP2 are disposed is illustrated as an example. The second connection part CP2 may be disposed on a layer different from those of the first sensing part SP1, the first connection part CP1, and the second sensing part SP2 and be formed from, for example, the first conductive layer CL1 (see FIG. 6A). In this embodiment, the second connection part CP2 may be defined as a bridge pattern.

Referring to FIG. 7C, the plurality of emission areas PXA-R, PXA-B, and PXA-G are disposed on the first sensing area S1. The emission areas disposed on the first sensing area S1 of the plurality of emission areas PXA-R, PXA-B, and PXA-G may be defined as a first emission area group.

The emission areas PXA-R, PXA-B, and PXA-G of the first emission area group include cell units CU1 and CU2 arranged in an n×n matrix, where n is a natural number 10 or more.

A 1-th row 1stL, an n-th row n-thL, a 2-th row 2ndL, 1-th column 1stC, a 2-th column 2ndC, and an n-th column n-thC are schematically illustrated. The cell units include first cell units CU1 and second cell units CU2.

Each of the first cell units CU1 includes a first emission area PXA-R and a third emission PXA-G arranged in a diagonal direction DR4 (or a fourth direction). Each of the second cell units CU2 includes a second emission area PXA-B and a third emission PXA-G arranged in a diagonal direction DR4.

The first cell units CU1 and the second cell units CU2 of the first emission area group have a first arrangement. In each of the rows arranged in n×n matrix, the first cell units CU1 and the second cell units CU2 are alternately disposed. When the 1-th cell unit of the odd-numbered rows is the first cell unit CU1, the 1-th cell unit of the even-numbered rows may be the second cell unit CU2.

As illustrated in FIG. 7C, the 1-th cell unit of the 1-th row of the first emission group may be the first cell unit CU1, and the n-th cell unit of the 1-th row may be the first cell unit CU1. The 1-th cell unit of the last row of the first emission group may be the first cell unit CU1, and the n-th cell unit of the n-th row n-thL may be the first cell unit CU1. As illustrated in FIG. 7C, the 1-th emission area of the 1-th emission area row corresponding to the first sensing area S1 may be the first emission area PXA-R.

That the first cell units CU1 and the second cell units CU2 of the first emission group have the first arrangement may be the same as that the first openings OP-MR, the second openings OP-MB, and the third opening OP-MG disposed in the first sensing areas S1 have the first arrangement. This is done because the first openings OP-MR, the second openings OP-MB, and the third opening OP-MG one-to-one correspond to the first emission area PAX-R, the second emission area PXA-B, and the third emission area PXA-G.

Referring to FIG. 7D, the two second connection parts CP2 connect the two second sensing parts SP2, which are spaced apart from each other. First to fourth connection areas CNT-A1 to CNT A4 are disposed between the two second connection parts CP2 and the two second sensing parts SP2.

Contact holes CNT-I may be defined in each of the first to fourth connection areas CNT-A1 to CNT A4. The first connection area CNT-A1 and the second connection area CNT-A2 may disposed by using the second emission area PXA-B as a center, and the third connection area CNT-A3 and the fourth connection area CNT-A4 may be disposed by using the first emission area PXA-R as a center.

The second connection part CP2 crosses a mesh line of the first sensing part SP1. The second connection part CP2 may be replaced with the mesh line of the first sensing part SP1 within the crossing area. The mesh line of the second connection part CP2 and the mesh line of the first sensing part SP1 may not overlap each other except for crossing points. The mesh line of the second connection part CP2 and the mesh line of the first sensing part SP1 may define openings replaced with the first openings OP-MR, the second opening OP-MB, and the third opening OP-MG.

The second rule will be described with reference to FIGS. 7E to 7G. The second sensing area S2 of FIG. 7E has a structure similar to that of the first sensing area S1 of FIG. 7B. Referring to FIG. 7F, the emission areas disposed on the second sensing area S2 of the plurality of emission areas PXA-R, PXA-B, and PXA-G may be defined as a second emission area group.

The emission areas PXA-R, PXA-B, and PXA-G of the second emission area group include first cell units CU1 and second cell units CU2 arranged in an n×n matrix. The first cell units CU1 and the second cell units CU2 of the second emission area group have a second arrangement different from the first arrangement described with reference to FIG. 7C.

The second arrangement is different from the first arrangement of FIG. 7C in that the first cell units CU1 and the second cell units CU2 are exchanged in position. When the 1-th cell unit of the odd-numbered rows is the second cell unit CU2, the 1-th cell unit of the even-numbered rows may be the first cell unit CU1.

As illustrated in FIG. 7F, the 1-th cell unit of the 1-th row 1stL of the second emission group may be the second cell unit CU2, and the n-th cell unit of the 1-th row 1stL may be the second cell unit CU2. The 1-th cell unit of the n-th row n-thL of the second emission group may be the second cell unit CU2, and the n-th cell unit of the n-th row n-thL may be the second cell unit CU2. As illustrated in FIG. 7F, the 1-th emission area of the 1-th emission area row corresponding to the second sensing area S2 may not be the first emission area PXA-R but be the second emission area PXA-B.

That the first cell units CU1 and the second cell units CU2 of the second emission group have the second arrangement may be the same mean as that the first openings OP-MR, the second openings OP-MB, and the third opening OP-MG disposed in the second sensing areas S3 have the second arrangement.

Referring to FIG. 7G, the two second connection parts CP2 connect half of the two second sensing parts SP2 to each other. The crossing area of the second sensing area S2 may have a structure similar to the crossing area of the first sensing area S1.

Referring to FIG. 7G, first to fourth connection areas CNT-A1 to CNT A4 are disposed between the two second connection parts CP2 and the two second sensing parts SP2. The first connection area CNT-A1 and the second connection area CNT-A2 may disposed by using the first emission area PXA-R as a center, and the third connection area CNT-A3 and the fourth connection area CNT-A4 may be disposed by using the second emission area PXA-B as a center.

As illustrated in FIGS. 7C and 7F, the reason in which the first and second emission groups adjacent to each other in the same row have the emission arrangements different from each other is because the first and second emission groups respectively have the odd-numbered rows and the even-numbered rows. In addition, this is done because the arrangement of the first type emission row PL1, the second type emission area PL2, and the third type emission row PL3, which are described with reference to FIG. 6E, is repeated.

In an exemplary embodiment of the inventive concepts, although the first and second emission groups do not have the odd-numbered rows and the even-numbered rows, the arrangement relationship between the first emission area PXA-R, the second emission area PXA-B, and the third emission area PXA-G, which is described with reference to FIG. 6E, may be changed to achieve the same result.

Referring to FIGS. 7C and 7F, a boundary between the first sensing part SP1 and the second sensing part SP2 may be defined by disconnection points of the mesh line. The disconnection pints of the first sensing part SP1 and the second sensing par SP2 of FIG. 7C may define a first boundary pattern BP1 of FIG. 7H. The disconnection points of the first sensing part SP1 and the second sensing part SP2 of FIG. 7F may define a second boundary pattern BP2 of FIG. 7H. The first boundary pattern BP1 and the second boundary pattern BP2 may connect the disconnection points to each other at the shortest distance.

The first boundary pattern BP1 and the second boundary pattern BP2 have shapes different from each other. As described above, the openings OP-MR, OP-MB, and OP-MG or the emission areas PXA-R, PXA-B, and PXA-G of the first sensing area S1 may have the first arrangement, and the openings OP-MR, OP-MB, and OP-MG or the emission areas PXA-R, PXA-B, and PXA-G of the second sensing area S2 may have the second arrangement.

Also, due to the above-described reasons, the mesh line of the first sensing area S1 has a first shape, and the mesh line of the second sensing area S2 has a second shape different from the first shape. Since the openings OP-MR, OP-MB, and OP-MG are defined by the mesh line ML, the mesh line ML may be needed to be deformed so as to change the arrangement of the openings OP-MR, OP-MB, and OP-MG.

As illustrated in FIG. 7I, the input sensor IS may further include a dummy pattern DDP that is insulated from the electrodes IE1-1 to IE1-10 of the first electrode group EG1 and the electrodes IE2-1 to IE2-8 of the second electrode group EG2. The dummy pattern DDP may be a floating pattern spaced apart from the sensing electrodes. The dummy pattern DDP may be disposed on the same layer as the first sensing parts SP1 and the second sensing parts SP2. In this embodiment, the dummy pattern DDP may be formed from the second conductive layer CL2.

The dummy pattern DDP may be disposed at a center of an area defined by a (k, j) sensing area, a (k+1, j) sensing area, a (k, j+1) sensing area, and a (k+1, j+1) sensing area of the sensing areas arranged in the p×q matrix, which is described with reference to FIG. 7A. Where k is a natural number of p or less, and j is a natural number of q or less. The dummy pattern DDP may be disposed on the boundary of the four sensing areas adjacent to each other to reduce a parasitic cap between the electrodes disposed in different rows and different columns.

Figure 8A:
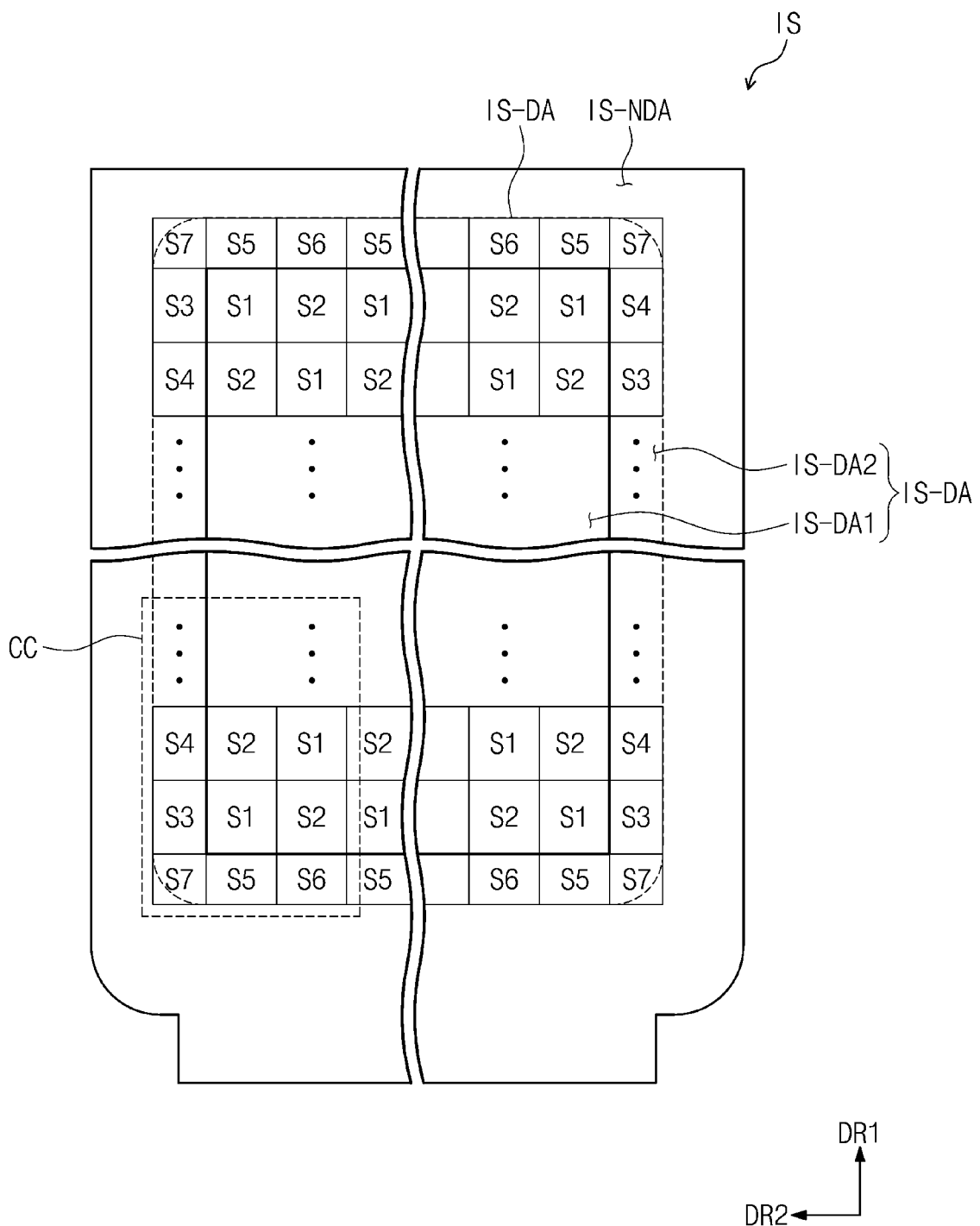
FIG. 8A is a plan view of an input sensor according to an exemplary embodiment of the inventive concepts.
Figure 8B:
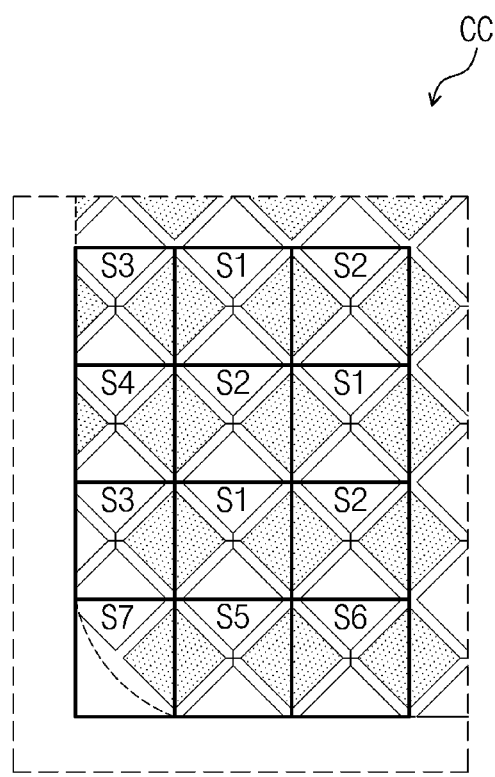
FIG. 8B is an enlarged plan view of an area CC of FIG. 8A.
Figure 8C:
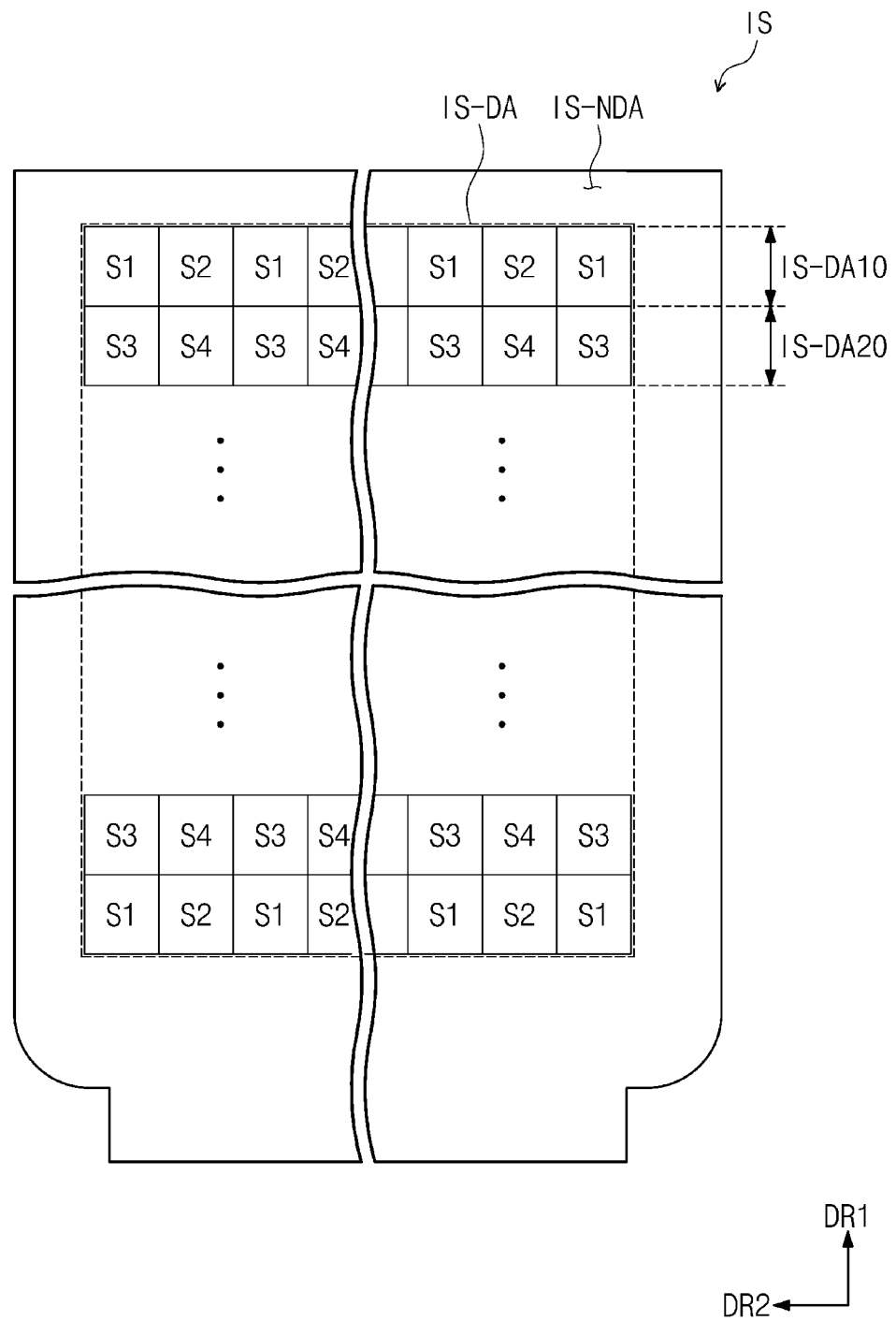
FIG. 8C is a plan view of an input sensor according to an exemplary embodiment of the inventive concepts.

FIG. 8A is a plan view of an input sensor according to an exemplary embodiment of the inventive concepts. FIG. 8B is an enlarged plan view of an area CC of FIG. 8A. FIG. 8C is a plan view of an input sensor IS according to an exemplary embodiment of the inventive concepts. Hereinafter, detailed descriptions with respect to the same constituent as that described with reference to FIGS. 6A to 7J will be omitted.

As illustrated in FIGS. 8A and 8B, the sensing area IS-DA may include an inner sensing area IS-DA1 and an outer sensing area IS-DA2 disposed outside the inner sensing area IS-DA1. The inner sensing area IS-DA1 may be divided into a plurality of first sensing areas S1 and a plurality of second sensing areas S2 as described with reference to FIGS. 6A to 7I.

The outer sensing area IS-DA2 may further several groups of the sensing areas. The outer sensing area may further include third sensing areas S3 and fourth sensing areas S4. The third sensing areas S3 and the fourth sensing areas S4 may have the same surface area and may have a surface area different from that of the first sensing area S1. Like this embodiment, each of the third sensing areas S3 and the fourth sensing areas S4 may have a surface area less than that of the first sensing area S1.

The third sensing areas S3 may be disposed adjacent to the first sensing areas S1, and the fourth sensing areas S4 may be disposed adjacent to the second sensing areas S2. The third sensing areas S3 are continuously disposed outside the first sensing area S1. The fourth sensing areas S4 are continuously disposed outside the second sensing area S2.

The emission areas disposed on the third sensing area S3 of the plurality of emission areas PXA-R, PXA-B, and PXA-G (see FIG. 6E) may be defined as a third emission area group. The emission areas disposed on the fourth sensing area S4 of the plurality of emission areas PXA-R, PXA-B, and PXA-G may be defined as a fourth emission area group.

The openings OP-MR, OP-MB, and OP-MG defined in the third sensing areas S3 may have a third arrangement different from the first and second arrangements described with reference to FIGS. 6A to 7I. Since the third sensing areas S3 has a surface area less than that of each of the first sensing area S1 and the second sensing area S2, the third sensing areas S3 may include the small number of openings OP-MR, OP-MB, and OP-MG (see FIG. 6).

The openings OP-MR, OP-MB, and OP-MG (see FIG. 6E) defined in the fourth sensing areas S4 may have a fourth arrangement different from the first and second arrangements described with reference to FIGS. 6A to 7I.

The fourth arrangement is different from the third arrangement. This will be described with reference to FIGS. 7C, 7F, and 8B. As illustrated in FIG. 7C, since the 1-th cell unit of the 1-th row 1stL of the first emission group is the first cell unit CU1, the n-th cell unit of the 1-th row of the third emission group is the second cell unit CU2. As illustrated in FIG. 7F, since the 1-th cell unit of the 1-th row 1stL of the second emission group is the second cell unit CU1, the n-th cell unit of the fourth emission group is the first cell unit CU1. As described above, the cell units disposed at corresponding positions of the third emission group and the fourth emission group are different from each other. That the cell units disposed at the corresponding positions are different from each other has the same mean as that the openings OP-MR, OP-MB, and OP-MG defined in corresponding positions are different from each other.

The outer sensing area IS-DA2 may further include fifth sensing areas S5, sixth sensing areas S6, and seventh sensing areas S7. In the fifth sensing areas S5 and the sixth sensing areas S6, the openings OP-MR, OP-MB, and OP-MG have an arrangement different from the first and second arrangements, like the third and fourth sensing areas S3 and S4. The fifth sensing areas S5 and the sixth sensing areas S6 may be disposed below the first sensing area S1 and the second sensing area S2. The seventh sensing area S7 may have a surface area less than that of each of other sensing areas S1 to S6.

As illustrated in FIG. 8C, the sensing area IS-DA may include a first inner sensing area IS-DA10 and a second sensing area IS-DA20. The first inner sensing area IS-DA10 may be divided into a plurality of first sensing areas S1 and a plurality of second sensing areas S2 as described with reference to FIGS. 6A to 7I.

The second sensing area IS-DA20 may be divided into a plurality of third sensing areas S3 and a plurality of fourth sensing areas S4. The third sensing areas S3 and the fourth sensing areas S4 have the same surface area as the first sensing area S1 and the second sensing area S2.

The third sensing areas S3 may be disposed adjacent to the first sensing areas S1, and the fourth sensing areas S4 may be disposed adjacent to the second sensing areas S2. The emission areas disposed on the third sensing area S3 of the plurality of emission areas PXA-R, PXA-B, and PXA-G (see FIG. 6E) may be defined as a third emission area group. The emission areas disposed on the fourth sensing area S4 of the plurality of emission areas PXA-R, PXA-B, and PXA-G may be defined as a fourth emission area group.

The openings OP-MR, OP-MB, and OP-MG defined in the third sensing areas S3 may have the same arrangement as the first arrangement described with reference to FIGS. 6A to 7I. However, a boundary pattern (hereinafter, referred to as a third boundary pattern) of the third sensing areas S3 may have a shape different from that of each of the first boundary pattern BP1 and the second boundary pattern BP2 of FIG. 7H. That is to say, a mesh line of the third sensing area S3 may have a third shape different from each of the first and second shapes.

The openings OP-MR, OP-MB, and OP-MG defined in the fourth sensing areas S4 may have the same arrangement as the second arrangement described with reference to FIGS. 6A to 7I. However, a boundary pattern (hereinafter, referred to as a fourth boundary pattern) of the fourth sensing areas S4 may have a shape different from that of each of the first boundary pattern BP1 and the second boundary pattern BP2 of FIG. 7H. That is to say, a mesh line of the fourth sensing area S4 may have a fourth shape different from each of the first and second shapes.

In this embodiment, the openings OP-MR, OP-MB, and OP-MG defined in each of the third sensing areas S3 may have an arrangement different from that of the OP-MR, OP-MB, and OP-MG defined in each of the fourth sensing areas S4. Thus, the third shape may be different from the fourth shape.

Figure 9A:
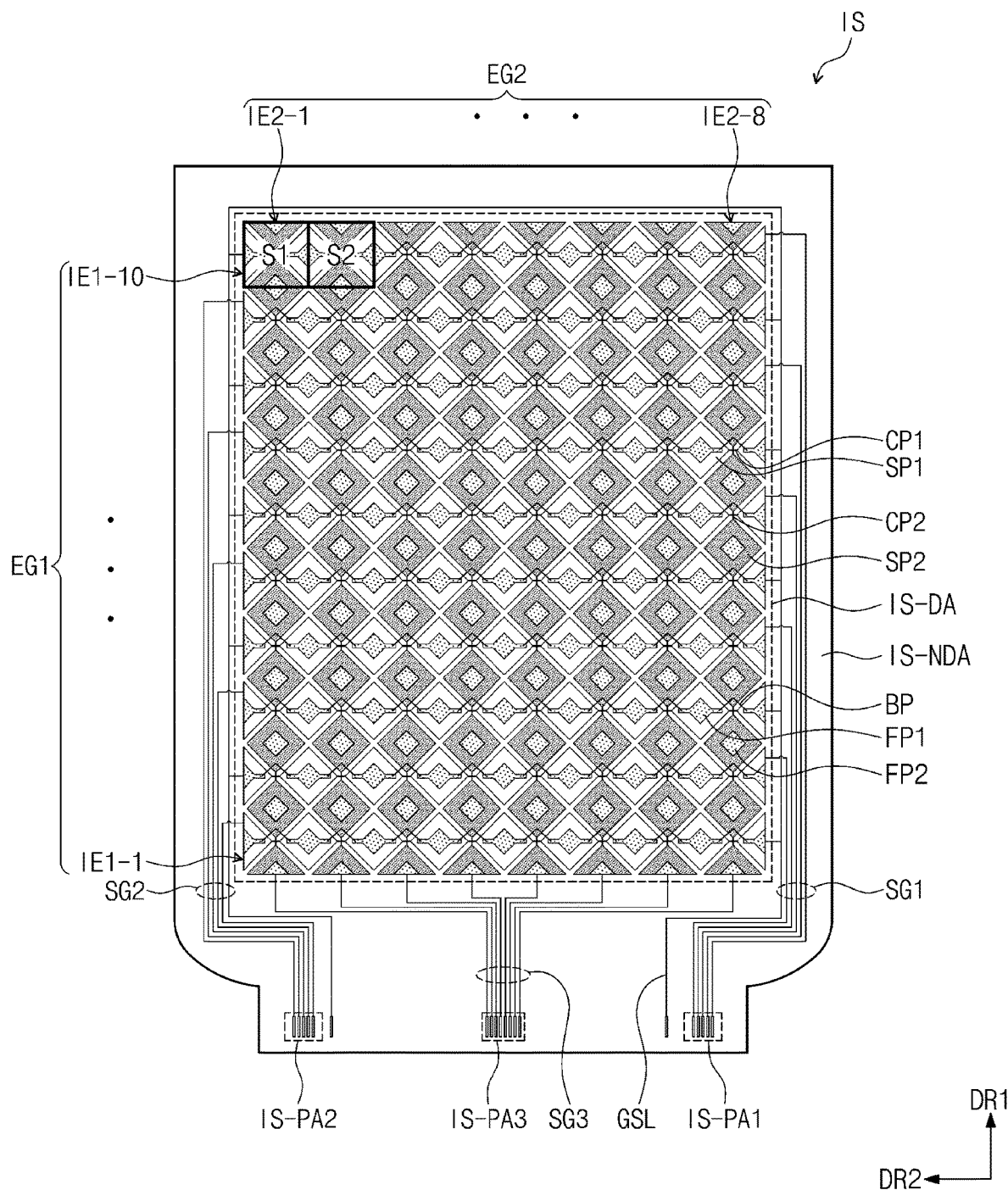
FIG. 9A is a plan view of an input sensor according to an exemplary embodiment of the inventive concepts.
Figure 9B:
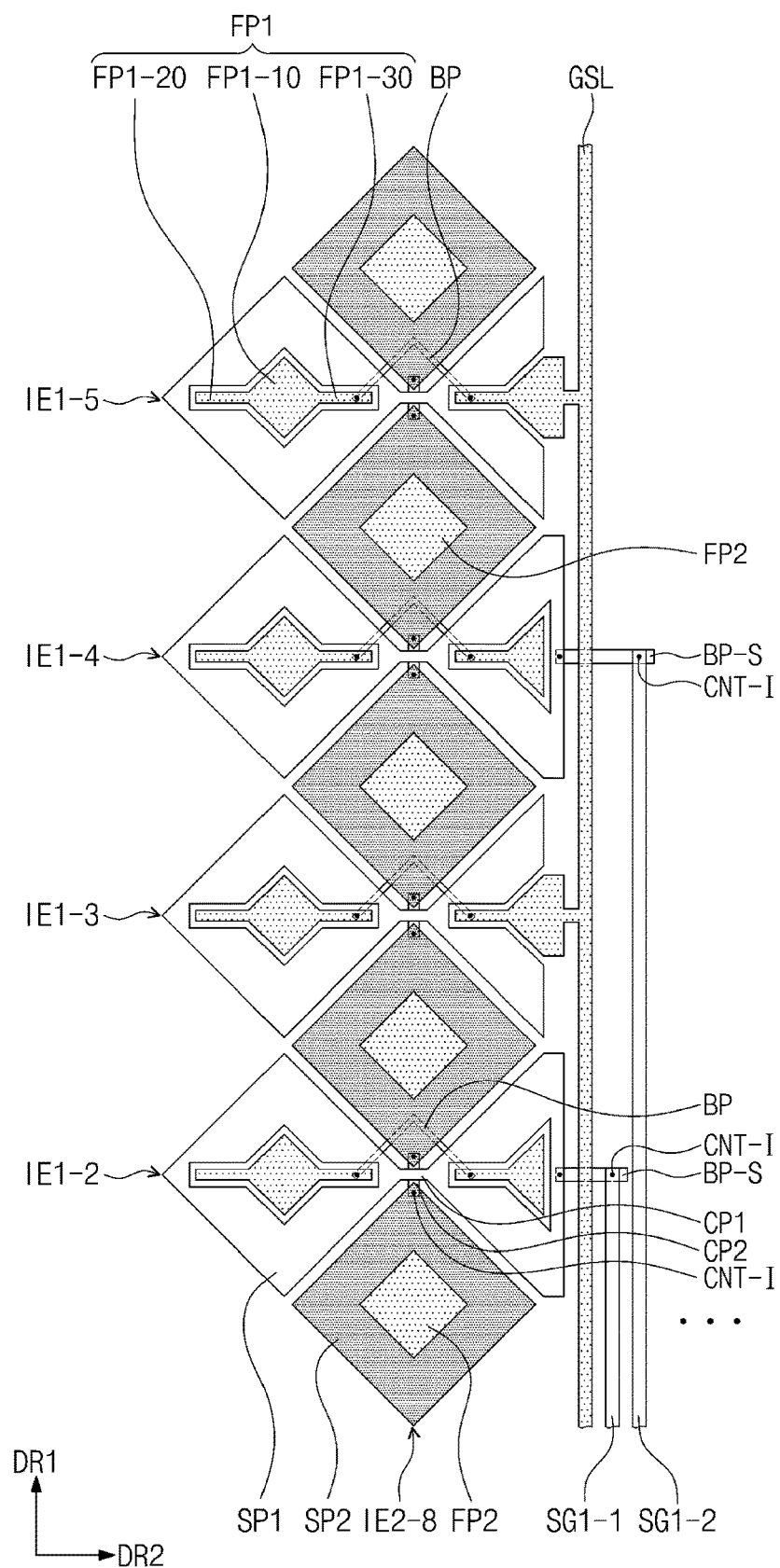
FIG. 9B is an enlarged plan view of a partial area of FIG. 9A.
Figure 9C:
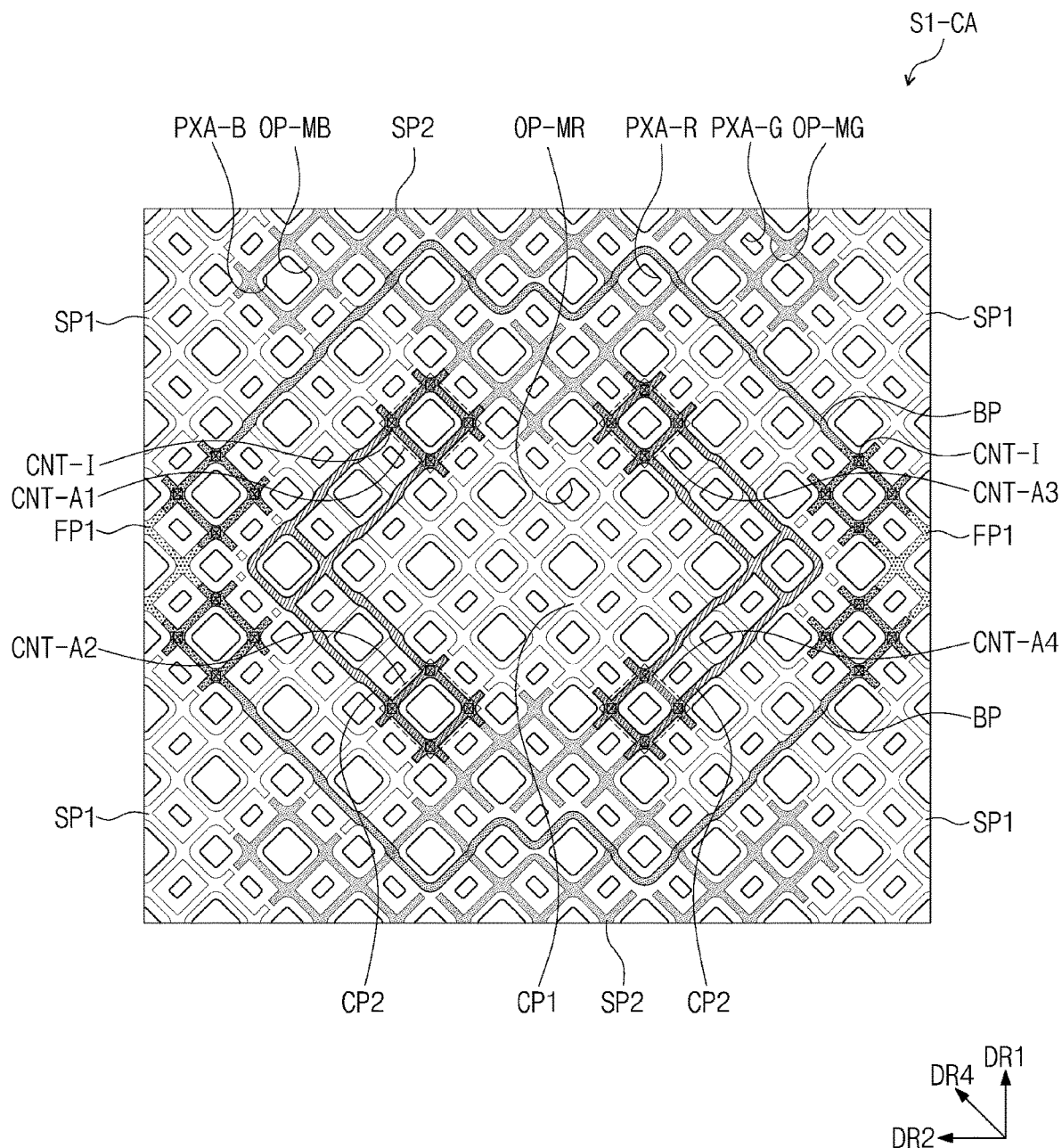
FIG. 9C is an enlarged plan view of a crossing area according to an exemplary embodiment of the inventive concepts.
Figure 9D:
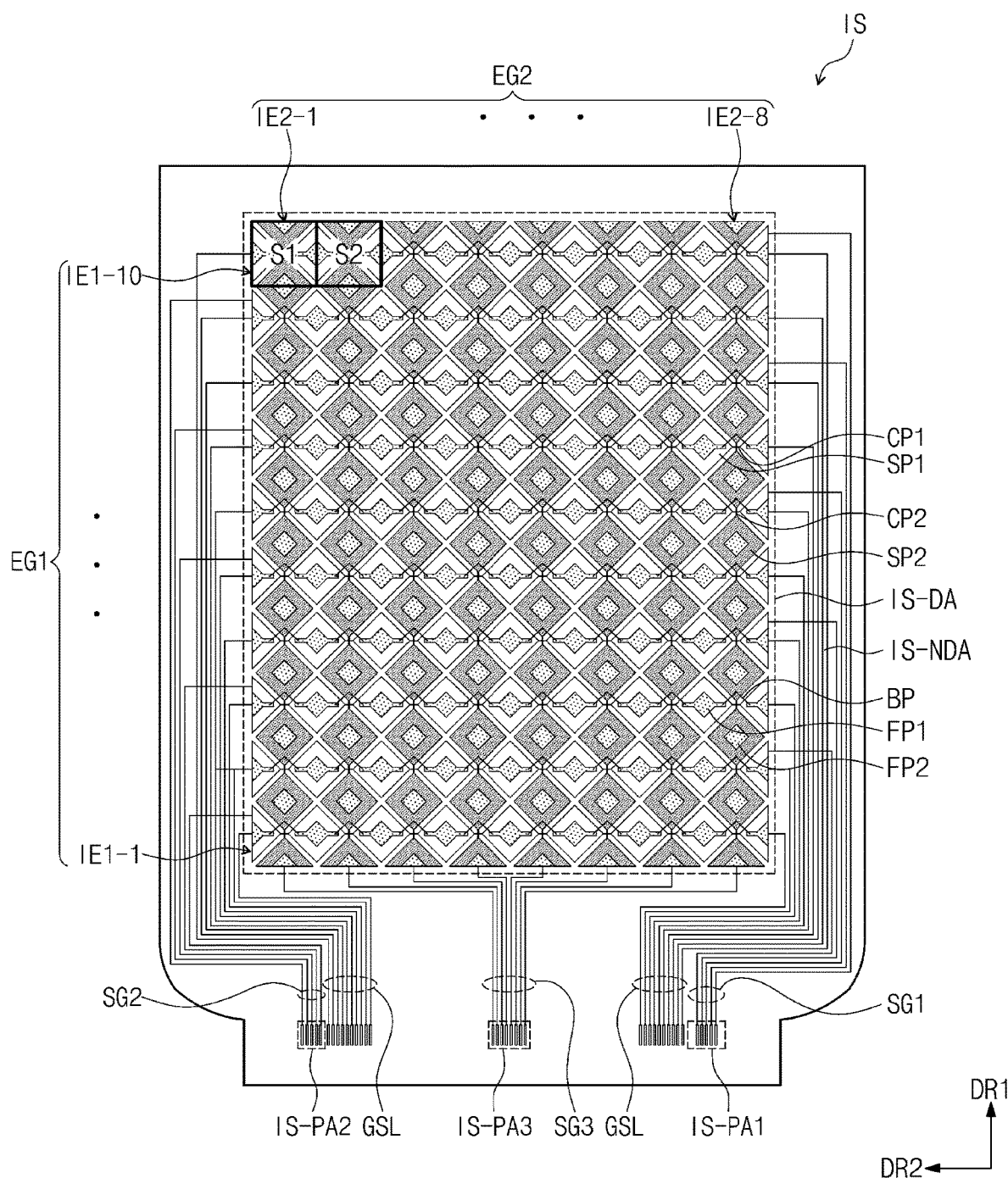
FIG. 9D is a plan view of an input sensor according to an exemplary embodiment of the inventive concepts.

FIG. 9A is a plan view of an input sensor IS according to an exemplary embodiment of the inventive concepts. FIG. 9B is an enlarged plan view of a partial area of FIG. 9A. FIG. 9C is an enlarged plan view of a crossing area according to an exemplary embodiment of the inventive concepts. FIG. 9D is a plan view of an input sensor according to an exemplary embodiment of the inventive concepts. Hereinafter, detailed descriptions with respect to the same constituent as that described with reference to FIGS. 6A to 8C will be omitted.

As illustrated in FIG. 9A, the input sensor IS may further include first floating patterns FP1 disposed inside the first sensing parts SP1 and second floating patterns FP2 disposed inside the second sensing parts SP2. The first floating patterns FP1 and the second floating patterns FP2 may reduce a parasitic cap between the input sensor IS and the display panel (e.g. see FIG. 6A).

The input sensor IS may further include floating connection parts BP (hereinafter, referred to as third connection parts) connecting the first floating patterns FP1. The third connection parts BP may be formed from the first conductive layer CL1 of FIG. 6A. The third connection parts BP may overlap the second sensing part SP2.

As illustrated in FIG. 9A, the input sensor IS may further include a dummy signal line GSL. The dummy signal line GSL may receive a predetermined bias voltage, for example, a ground voltage. The dummy signal line GSL may be connected to the first floating patterns FP1. The dummy signal line GSL may receive electrical signals for sensing noise on the sensing area IS-DA.

The dummy signal line GSL may be formed from the second conductive layer CL2 of FIG. 6A. A signal line connection part BP-S (hereinafter, referred to as a fourth connection part) may be disposed on a crossing area between the dummy signal line SGL and the first and second signal line groups SG1 and SG2.

FIG. 9B illustrates an enlarged view of a portion of the first sensing electrodes IE1-2 to IE1-5 and the rightmost second sensing electrode IE2-8. The dummy signal line GSL may be directly connected to the first floating patterns FP1 disposed inside the odd-numbered first sensing electrodes IE1-3 and IE1-5. The even-numbered first sensing electrodes IE1-2 and IE1-4 may be connected to corresponding signal lines SG1-1 and SG1-2 through the fourth connection part BP-S. The fourth connection part BP-S may be formed from the first conductive layer CL1 of FIG. 6A.

As illustrated in FIG. 9B, at least one of the first floating patterns FP1 may include a central part FP1-10 and extension parts FP1-20 and FP1-30 disposed on both sides of the central part FP1-10 in the second direction DR2. Each of the extension parts FP1-20 and the FP1-30 is connected to the corresponding third connection part BP. The first floating patterns FP1 disposed on both ends of the first floating patterns FP1 in the second direction DR2 may have shapes different from those of other first floating patterns FP1. The first floating patterns FP1 disposed the ends may include the central part and only one extension part disposed on one side of the central part.

FIG. 9C is an enlarged plan view of a crossing area S1-CA according to an exemplary embodiment of the inventive concepts. FIG. 9C illustrates an area corresponding to that of FIG. 7D. FIG. 9C illustrates a crossing area including two third connection parts BP, unlike FIGS. 8A and 9B.

The two third connection parts BP may be disposed outside the two second connection parts CP2. Four connection areas may be disposed between the two third connection parts BP and the two first floating patterns FP1. Four contact holes CNT-I may be respectively defined in the four connection areas.

As illustrated in FIG. 9D, a dummy signal line GSL may be provided in plurality. The same number of dummy signal lines GSL as the electrodes of the first electrode group EG1 may be disposed. Each of the dummy signal line GSL may be connected to the first floating patterns FP1 disposed inside the corresponding first sensing electrode.

Figure 10A:
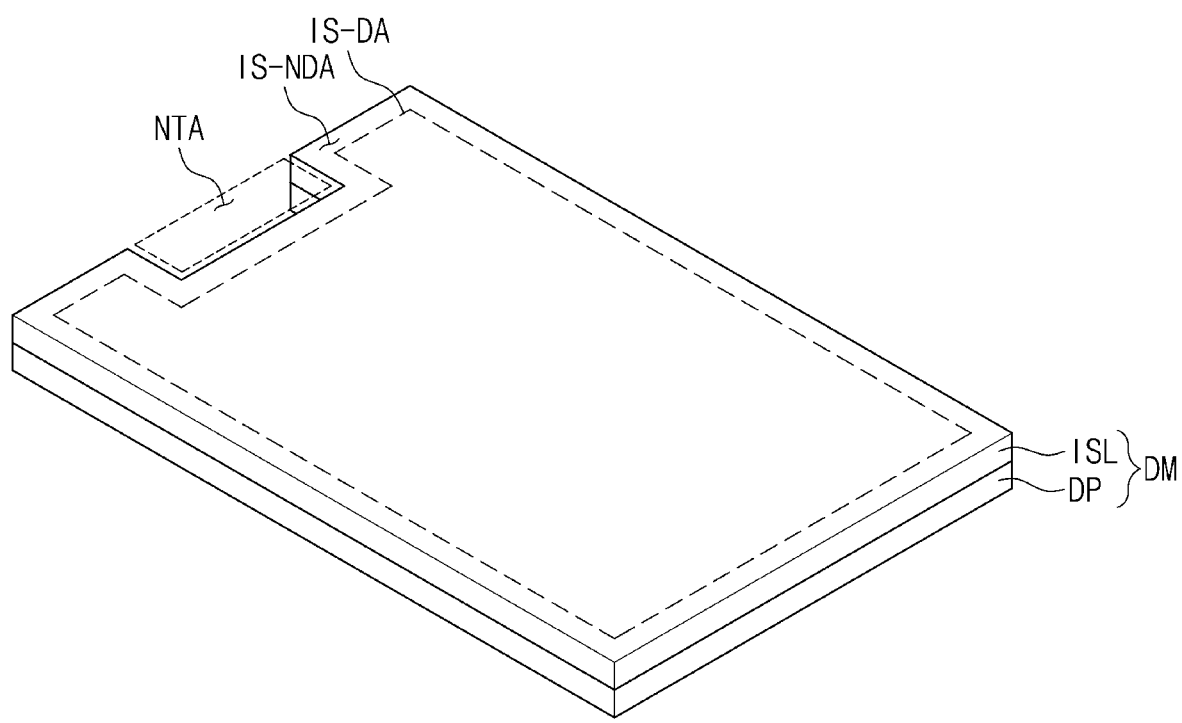
FIG. 10A is a perspective view of a display module according to an exemplary embodiment of the inventive concepts.
Figure 10B:
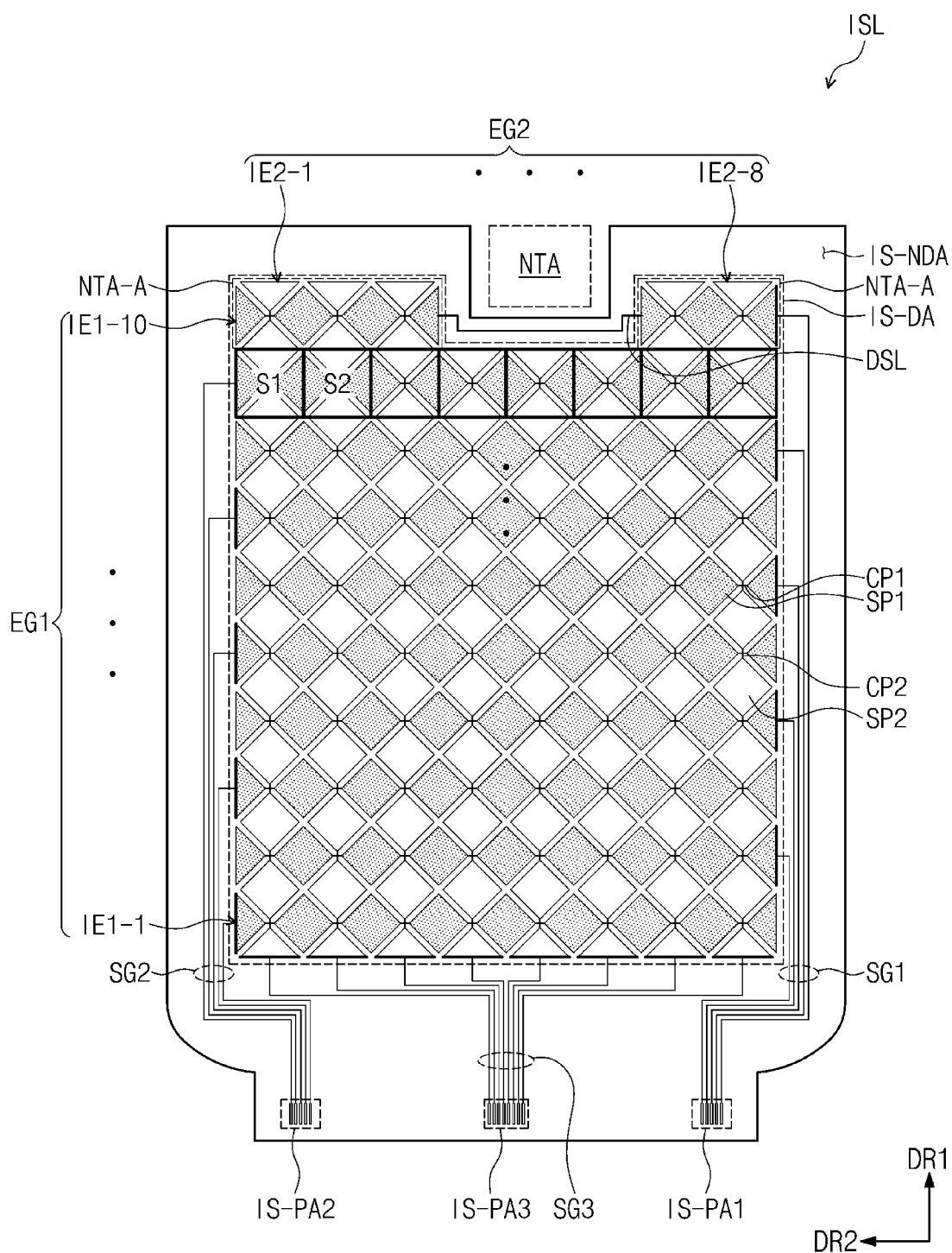
FIG. 10B is a plan view of an input sensing layer according to an exemplary embodiment of the inventive concepts.
Figure 11A:
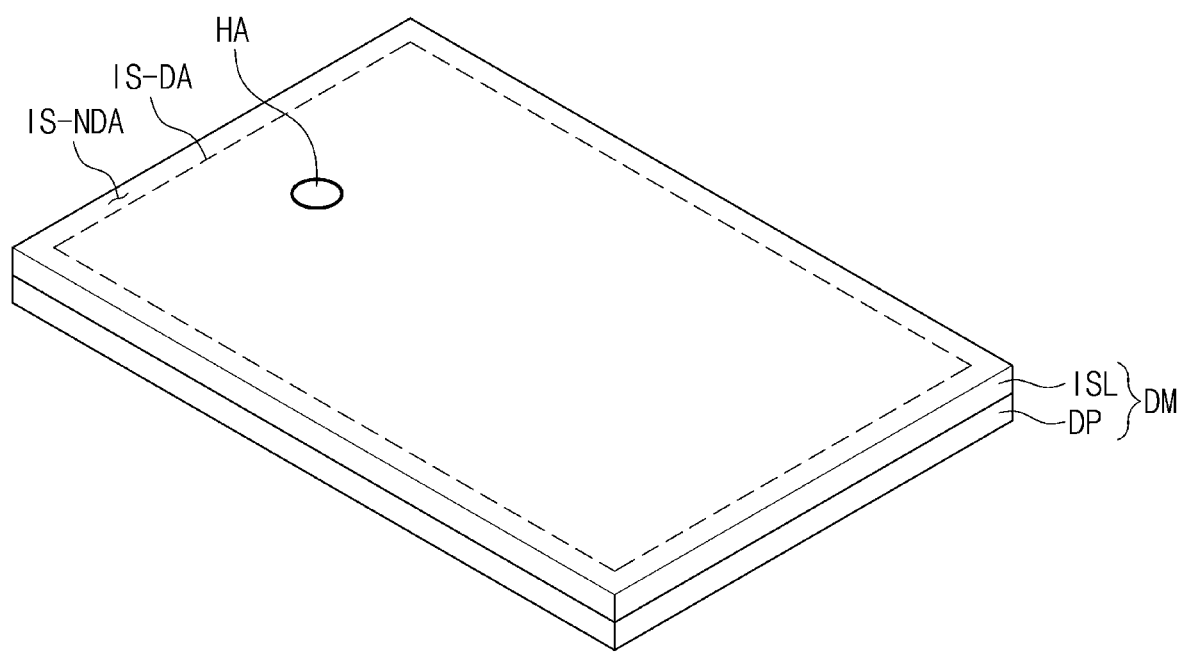
FIG. 11A is a perspective view of a display module according to an exemplary embodiment of the inventive concepts.
Figure 11B:
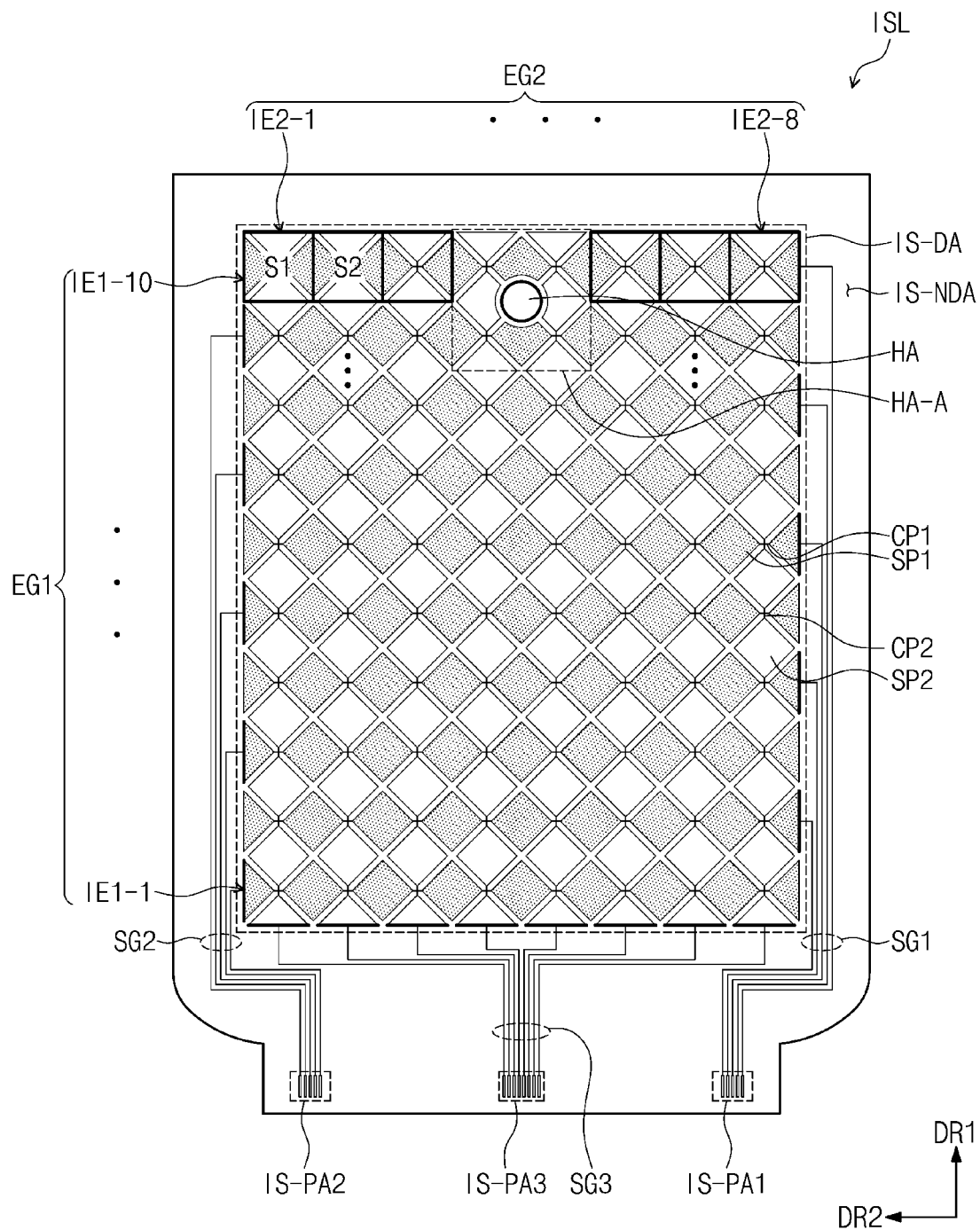
FIG. 11B is a plan view of an input sensing layer according to an exemplary embodiment of the inventive concepts.

FIG. 10A is a perspective view of a display module DM according to an exemplary embodiment of the inventive concepts. FIG. 10B is a plan view of an input sensing layer ISL according to an exemplary embodiment of the inventive concepts. FIG. 11A is a perspective view of a display module DM according to an exemplary embodiment of the inventive concepts. FIG. 11B is a plan view of an input sensing layer ISL according to an exemplary embodiment of the inventive concepts. In FIGS. 10A to 11B, a "layer"-type input sensor is illustrated as an example.

As illustrated in FIG. 10A, the display module DM has a notching area NTA that is recessed inward on the plane. The notching area NTA may be defined in each of the display panel DP and the input sensing layer ISL. Here, it is unnecessary that the notching areas NTA are the same. The notching area NTA may be defined in a central area in the second direction DR2. However, the exemplary embodiment of the inventive concepts is not limited to the notching area NTA defined in the central portion.

As illustrated in FIG. 10B, the first and second electrode groups EG1 and EG2 may be deformed in shape by the notching area NTA. The disposition and arrangement of the first and second signal line groups SG1 and SG2 may be substantially the same as those of the input sensing layer ISL of FIG. 6B.

As illustrated in FIG. 10B, since the notching area NTA is formed, the 10-th electrode IE1-10 may be divided into two portions. The two portions may be connected to each other by the dummy connection line DSL. Each of the 4-th to 6-th electrodes IE2-4 to IE-2-6 of the second electrode group EG2 may have a length less than that of each of other electrodes.

The remaining sensing area IS-DA except for the area NTA-A corresponding to the 10-th electrode IE1-10, which is divided into two parts, of the sensing areas IS-DA may be divided into first sensing areas S1 and second sensing areas S2. The area NTA-A corresponding to the 10-th electrode IE1-10 may be divided into the first sensing areas S1 and the second sensing areas S2 or divided into sensing areas different from the first and second sensing areas S1 and S2.

As illustrated in FIG. 11A, the display module DM has a hole area HA that is recessed inward on the plane. A portion of each of the display panel DP and the input sensing layer ISL may be removed to define the hole area HA. It is unnecessary that the hole areas HA of the display panel DP and the input sensing layer ISL are the same. The hole area HA may be a moving path for an optical signal. A plurality of hole areas HA may be defined in the display module DM.

The hole area HA of the display panel DP may be formed by removing areas corresponding to the plurality of PXA-R, PXA-G, and PXA-B (see FIG. 6C). The hole area HA of the input sensing layer ISL may be an area from which the sensing parts SP1 and SP2 are removed.

As illustrated in FIG. 11B, the first and second electrode groups EG1 and EG2 may be deformed in shape by the hole area HA. The disposition and arrangement of the first and second signal line groups SG1 and SG2 may be substantially the same as those of the input sensing layer ISL of FIG. 6B.

The hole area HA of the input sensing layer ISL may be disposed on a crossing area between the first and second electrode groups EG1 and EG2. Here, a dummy connection line (not shown) may be disposed around the hole area HA of the input sensing layer ISL. For example, the dummy connection line may bypass the hole area HA to connect the first and second electrode groups EG1 and EG2 to each other.

Most of the sensing area IS-DA except for the area HA-A adjacent to the hole area HA among the sensing areas IS-DA may be divided into first sensing area S1 and second sensing areas S2. A portion of the sensing area adjacent to the hole area HA may be divided into sensing areas different from the first and second sensing areas S1 and S2.

According to the exemplary embodiment, since the sensing electrodes are to completely disposed on the sensing area, the input sensing reliability may be improved.

The two kinds of sensing areas may be provided to improve the degree of freedom in design of the input sensor. Although the mesh lines disposed on the two kinds of sensing areas have shapes different from each other, the sensing deviation may be minimized.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a plurality of emission areas in which a plurality of light emitting elements is disposed; and
   an input sensor disposed above the display panel and comprising a sensing area and a line area,
   wherein the input sensor comprises:
   a plurality of first sensing electrodes which are disposed on the sensing area, in which a plurality of openings corresponding to the plurality of emission areas are defined, and which are arranged in a first direction and extend in a second direction crossing the first direction;
   a plurality of second sensing electrodes which are disposed on the sensing area to cross the plurality of first sensing electrodes and in which a plurality of openings corresponding to the plurality of emission areas are defined; and
   signal lines disposed on the line area and connected to the plurality of first sensing electrodes and the plurality of second sensing electrodes,
   wherein at least a portion of the sensing area is divided into a plurality of first sensing areas and a plurality of second sensing areas, which are alternately disposed in the first direction and the second direction,
   the plurality of first sensing areas and the plurality of second sensing areas have the same surface area,
   each of the plurality of first sensing areas and the plurality of second sensing areas comprises a corresponding crossing area of crossing areas between the plurality of first sensing electrodes and the plurality of second sensing electrodes,
   the plurality of openings of each of the plurality of first sensing areas have a first arrangement, and
   the plurality of openings of each of the plurality of second sensing areas have a second arrangement different from the first arrangement,
   wherein the input sensor further comprises a dummy pattern that is insulated from the plurality of first sensing electrodes and the plurality of second sensing electrodes,
   the plurality of first sensing areas and the plurality of second sensing areas are arranged in a p×q matrix, where each of p and q is a natural number of 5 or more, and
   the dummy pattern is disposed at a center of an area defined by a (k, j) sensing area, a (k+1, j) sensing area, a (k, j+1) sensing area, and a (k+1, j+1) sensing area of the sensing areas arranged in the p×q matrix, where k is a natural number of q or less, and j is a natural number of q or less.

2. The display device of claim 1, wherein the plurality of emission areas comprise:
   a first emission area having a first surface area;
   a second emission area having a second surface area different from the first surface area; and
   a third emission area having a third surface area different from each of the first and second surface areas,
   wherein the first emission area, the second emission area, and the third emission area provide different color of light from each other.

3. The display device of claim 2, wherein the plurality of openings having the first arrangement and the plurality of openings having the second arrangement comprise a first opening corresponding to the first emission area, a second opening corresponding to the second emission area, and a third opening corresponding to the third emission area.

4. The display device of claim 1, wherein each of the plurality of first sensing electrodes comprises first sensing parts arranged in the second direction and first connection parts disposed between adjacent sensing parts of the first sensing parts,
    each of the plurality of second sensing electrodes comprises second sensing parts arranged in the first direction and second connection parts disposed between adjacent sensing parts of the second sensing parts, and
    one of the first connection parts and the second connection parts is disposed on a layer different from those of the first sensing parts and the second sensing parts, and the other is disposed on the same layer as the first sensing parts and the second sensing parts.

5. The display device of claim 1, wherein the signal lines comprise:
    first signal lines electrically connected through one end of each of even-numbered electrode of the plurality of first sensing electrodes;
    second signal lines electrically connected through the other end of each of odd-numbered electrodes of the plurality of first sensing electrodes; and
    third signal lines electrically connected to the plurality of second sensing electrodes.

6. The display device of claim 1, wherein each of the plurality of light emitting elements comprises a first electrode, a second electrode apart from the first electrode, and a light emitting layer disposed between the first electrode and the second electrode, and
    wherein the light emitting layer comprises at least one of quantum dot and a quantum rod.

7. A display device comprising:
    a display panel comprising a plurality of emission areas in which a plurality of light emitting elements is disposed; and
    an input sensor disposed above the display panel and comprising a sensing area and a line area,
    wherein the input sensor comprises:
        a plurality of first sensing electrodes which are disposed on the sensing area and in which a plurality of openings corresponding to the plurality of emission areas are defined;
        a plurality of second sensing electrodes which are disposed on the sensing area to cross the plurality of first sensing electrode and in which a plurality of openings corresponding to the plurality of emission areas are defined; and
        signal lines disposed on the line area and connected to the plurality of first sensing electrodes and the plurality of second sensing electrodes;
    wherein the plurality of emission areas comprise:
        a first emission area having a first surface area;
        a second emission area having a second surface area different from the first surface area; and
        a third emission area having a third surface area different from each of the first and second surface areas,
    wherein:
        the first emission area, the second emission area, and the third emission area provide different color of light from each other,
        at least a portion of the sensing area is divided into a plurality of first sensing areas and a plurality of second sensing areas, which are alternately disposed,
        the plurality of first sensing areas and the plurality of second sensing areas have the same surface area,
        each of the plurality of first sensing areas and the plurality of second sensing areas comprises a corresponding crossing area of crossing areas between the plurality of first sensing electrodes and the plurality of second sensing electrodes,
        the plurality of openings of each of the plurality of first sensing areas have a first arrangement,
        the plurality of openings of each of the plurality of second sensing areas have a second arrangement different from the first arrangement,
        the plurality of openings having the first arrangement and the plurality of openings having the second arrangement comprise a first opening corresponding to the first emission area, a second opening corresponding to the second emission area, and a third opening corresponding to the third emission area,
        emission areas, which are disposed on each of the plurality of first sensing areas, of the plurality of emission areas are defined as a first emission area group, and emission areas, which are disposed on each of the plurality of second sensing areas, of the plurality of emission areas are defined as a second emission area group,
        each of the first emission area group and the second emission area group comprises cell units arranged in an n×n matrix, where n is a natural number of 10 or more,
        the cell units comprise first cell units and second cell units,
        each of the first cell units comprises the first emission area and the third emission area, which are disposed in a diagonal direction,
        each of the second cell units comprises the second emission area and the third emission area, which are arranged in a diagonal direction, and
        the first cell units and the second cell units of the first emission area group have a first arrangement, and the first cell units and the second cell units of the second emission area group have a second arrangement different from the first arrangement.

8. The display device of claim 7, wherein n is an odd number.

9. The display device of claim 7, wherein the third emission area of each of the first cell units is a first type emission area, and the third emission area of each of the second cell units is a second type emission area, and
    the first type emission area and the second type emission area have shape different from each other on a plane.

10. The display device of claim 7, wherein a first boundary pattern defined by disconnection points of the first sensing electrode and the second sensing electrode, which correspond to each of the plurality of first sensing areas, of the plurality of first sensing electrodes and the plurality of second sensing electrodes is different from a second boundary pattern defined by disconnection points of the first sensing electrode and the second sensing electrode, which correspond to each of the plurality of second sensing areas, of the plurality of first sensing electrodes and the plurality of second sensing electrodes.

11. A display device comprising:
    a display panel comprising a plurality of emission areas in which a plurality of light emitting elements is disposed; and
    an input sensor disposed above the display panel and comprising a sensing area and a line area,
    wherein the input sensor comprises:

a plurality of first sensing electrodes which are disposed on the sensing area and in which a plurality of openings corresponding to the plurality of emission areas are defined;

a plurality of second sensing electrodes which are disposed on the sensing area to cross the plurality of first sensing electrode and in which a plurality of openings corresponding to the plurality of emission areas are defined; and signal lines disposed on the line area and connected to the plurality of first sensing electrodes and the plurality of second sensing electrodes, wherein at least a portion of the sensing area is divided into a plurality of first sensing areas and a plurality of second sensing areas, which are alternately disposed, the plurality of first sensing areas and the plurality of second sensing areas have the same surface area, each of the plurality of first sensing areas and the plurality of second sensing areas comprises a corresponding crossing area of crossing areas between the plurality of first sensing electrodes and the plurality of second sensing electrodes, the plurality of openings of each of the plurality of first sensing areas have a first arrangement, and the plurality of openings of each of the plurality of second sensing areas have a second arrangement different from the first arrangement, wherein the at least the portion of the sensing area is defined as an inner sensing area, and the sensing area further comprises an outer sensing area disposed outside the inner sensing area, the outer sensing area comprises a plurality of third sensing areas adjacent to the plurality of first sensing areas and a plurality of fourth sensing areas adjacent to the plurality of second sensing areas, and the plurality of openings of each of the plurality of third sensing areas have a third arrangement different from the first arrangement and the second arrangement, and the plurality of openings of each of the plurality of fourth sensing areas have a fourth arrangement different from the first arrangement and the second arrangement.

12. The display device of claim 11, wherein each of the plurality of third sensing areas has a surface area different from that of each of the plurality of first sensing areas.

13. The display device of claim 12, wherein the at least the portion of the sensing area is defined as a first inner sensing area, and the sensing area further comprises a second inner sensing area disposed adjacent to the first inner sensing area, the second inner sensing area comprises a plurality of third sensing areas adjacent to the plurality of first sensing areas and fourth sensing areas adjacent to the plurality of second sensing areas, and the plurality of first sensing areas and the plurality of second sensing areas, and the plurality of third sensing areas and the plurality of fourth sensing areas have the same surface area, each of the plurality of first sensing electrodes and the plurality of second sensing electrodes comprises a mesh line defining the plurality of openings, the plurality of openings comprise first openings having a first surface area, second openings having a second surface area different from the first surface area, and third openings having a third surface area different from the first surface area and the second surface area, and the mesh line disposed on each of the plurality of first sensing areas has a first shape, the mesh line disposed on each of the plurality of second sensing areas has a second shape different from the first shape, the mesh line disposed on each of the plurality of third sensing areas has a third shape different from the first shape and the second shape, and the mesh line disposed on each of the plurality of fourth sensing areas has a fourth shape different from the first shape, the second shape, and the third shape.

14. A display device comprising:
a display panel comprising a plurality of emission areas in which a plurality of light emitting elements is disposed; and an input sensor disposed above the display panel and comprising a sensing area and a line area, wherein the input sensor comprises:
a plurality of first sensing electrodes which are disposed on the sensing area, in which a plurality of openings corresponding to the plurality of emission areas are defined, and which are arranged in a first direction and extend in a second direction crossing the first direction;

a plurality of second sensing electrodes which are disposed on the sensing area to cross the plurality of first sensing electrodes and in which a plurality of openings corresponding to the plurality of emission areas are defined; and signal lines disposed on the line area and connected to the plurality of first sensing electrodes and the plurality of second sensing electrodes, wherein:
at least a portion of the sensing area is divided into a plurality of first sensing areas and a plurality of second sensing areas, which are alternately disposed in the first direction and the second direction, the plurality of first sensing areas and the plurality of second sensing areas have the same surface area, each of the plurality of first sensing areas and the plurality of second sensing areas comprises a corresponding crossing area of crossing areas between the plurality of first sensing electrodes and the plurality of second sensing electrodes, the plurality of openings of each of the plurality of first sensing areas have a first arrangement, the plurality of openings of each of the plurality of second sensing areas have a second arrangement different from the first arrangement, each of the plurality of first sensing electrodes comprises first sensing parts arranged in the second direction and first connection parts disposed between adjacent sensing parts of the first sensing parts, each of the plurality of second sensing electrodes comprises second sensing parts arranged in the first direction and second connection parts disposed between adjacent sensing parts of the second sensing parts, one of the first connection parts and the second connection parts is disposed on a layer different from those of the first sensing parts and the second sensing parts, and the other is disposed on the same layer as the first sensing parts and the second sensing parts, and the input sensor further comprises:
first floating patterns disposed inside the first sensing parts on a plane and apart from the first sensing parts; and second floating patterns disposed inside the second sensing parts on a plane and apart from the second sensing parts.

15. The display device of claim 14, wherein the input sensor further comprises third connection parts connecting the first floating patterns to each other.

16. The display device of claim 15, wherein at least one of the first floating patterns comprises:
a central part; and
extension parts disposed on both sides of the central part in the second direction,
wherein each of the extension parts is connected to a corresponding third connection part of the third connection parts.

17. A display device comprising:
a display panel comprising a plurality of emission areas in which a plurality of light emitting elements is disposed; and
an input sensor disposed above the display panel and comprising a sensing area and a line area,
wherein the input sensor comprises:
a plurality of first sensing electrodes which are disposed on the sensing area, in which a plurality of openings corresponding to the plurality of emission areas are defined, and which are arranged in a first direction and extend in a second direction crossing the first direction;
a plurality of second sensing electrodes which are disposed on the sensing area to cross the plurality of first sensing electrodes and in which a plurality of openings corresponding to the plurality of emission areas are defined; and
signal lines disposed on the line area and connected to the plurality of first sensing electrodes and the plurality of second sensing electrodes,
wherein:
at least a portion of the sensing area is divided into a plurality of first sensing areas and a plurality of second sensing areas, which are alternately disposed in the first direction and the second direction,
the plurality of first sensing areas and the plurality of second sensing areas have the same surface area,
each of the plurality of first sensing areas and the plurality of second sensing areas comprises a corresponding crossing area of crossing areas between the plurality of first sensing electrodes and the plurality of second sensing electrodes,
the plurality of openings of each of the plurality of first sensing areas have a first arrangement,
the plurality of openings of each of the plurality of second sensing areas have a second arrangement different from the first arrangement,
each of the plurality of first sensing electrodes comprises first sensing parts arranged in the second direction and first connection parts disposed between adjacent sensing parts of the first sensing parts,
each of the plurality of second sensing electrodes comprises second sensing parts arranged in the first direction and second connection parts disposed between adjacent sensing parts of the second sensing parts,
one of the first connection parts and the second connection parts is disposed on a layer different from those of the first sensing parts and the second sensing parts, and the other is disposed on the same layer as the first sensing parts and the second sensing parts, and
each of the plurality of first sensing areas comprises:
a corresponding first connection part of the first connection parts:
a half of a first sensing part disposed on one side of the corresponding first connection part of the first sensing part in the second direction and a half of a first sensing part disposed on the other side of the corresponding first connection part in the second direction,
a corresponding second connection part of the second connection part, and
a half of a second sensing part disposed on one side of the corresponding second connection part in the first direction and a half of a second sensing part disposed on the other side of the corresponding second connection part in the first direction.

18. A display device comprising:
a display panel; and
an input sensor disposed above the display panel,
wherein the input sensor comprises:
a plurality of first sensing electrodes which are arranged in a first direction and extend in a second direction crossing the first direction; and
a plurality of second sensing electrodes crossing the plurality of first sensing electrodes,
wherein each of the plurality of first sensing electrodes and the plurality of second sensing electrodes comprises a mesh line defining first openings having a first surface area, second openings having a second surface area different from the first surface area, and third openings having a third surface area different from the first surface area and the second surface area,
at least a portion of areas on which the plurality of first sensing electrodes and the plurality of second sensing electrodes are disposed is divided into a plurality of first sensing areas and a plurality of second sensing areas, which are alternately disposed in the first direction and the second direction, and the plurality of first sensing areas and the plurality of second sensing areas have the same area,
each of the plurality of first sensing areas and the plurality of second sensing areas comprises a corresponding crossing area of crossing areas between the plurality of first sensing electrodes and the plurality of second sensing electrodes, and
the mesh line disposed on each of the plurality of first sensing areas has a first shape, and the mesh line disposed on each of the plurality of second sensing areas has a second shape different from the first shape, and
a first boundary pattern defined by disconnection points of the mesh line of the first sensing electrode and the mesh line of the second sensing electrode, which correspond to each of the plurality of first sensing areas, of the plurality of first sensing electrodes and the plurality of second sensing electrodes is different from a second boundary pattern defined by disconnection points of the mesh line of the first sensing electrode and the mesh line of the second sensing electrode, which correspond to each of the plurality of second sensing areas, of the plurality of first sensing electrodes and the plurality of second sensing electrodes.

19. The display device of claim 18, wherein the display panel comprises first emission areas corresponding to the first openings, second emission areas corresponding to the second openings, and third emission areas corresponding to the third openings,
the first emission areas, the second emission areas, and the third emission areas are arranged to define a plurality of emission area rows,
a 1-th emission area of a 1-th emission area row corresponding to each of the plurality of first sensing areas is one of the first emission areas, and a 1-th emission area of a 1-th emission area row corresponding to each of the plurality of second sensing areas is one of the second emission areas.

20. The display device of claim 18, wherein the display panel includes an organic light emitting display panel or a quantum dot light emitting display panel.

* * * * *